(12) United States Patent
Street et al.

(10) Patent No.: US 9,574,080 B1
(45) Date of Patent: Feb. 21, 2017

(54) DIAMOND-DISPERSED FIBER-REINFORCED COMPOSITE FOR SUPERIOR FRICTION AND WEAR PROPERTIES IN EXTREME ENVIRONMENTS AND METHOD FOR FABRICATING THE SAME

(75) Inventors: Kenneth Street, North Olmsted, OH (US); Oleg A Voronov, East Strandsburg, PA (US); Bernard H Kear, Whitehouse Station, NJ (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 357 days.

(21) Appl. No.: 13/311,987

(22) Filed: Dec. 6, 2011

Related U.S. Application Data

(60) Provisional application No. 61/444,168, filed on Feb. 18, 2011.

(51) Int. Cl.
| | | |
|---|---|---|
| *C08L 63/00* | (2006.01) | |
| *C08G 59/00* | (2006.01) | |
| *C01B 31/06* | (2006.01) | |
| *C30B 29/04* | (2006.01) | |
| *B32B 27/38* | (2006.01) | |

(52) U.S. Cl.
CPC ............. *C08L 63/00* (2013.01); *B32B 27/38* (2013.01); *C01B 31/06* (2013.01); *C08G 59/00* (2013.01); *C30B 29/04* (2013.01); *B32B 2255/02* (2013.01); *B32B 2260/021* (2013.01); *B32B 2307/746* (2013.01); *Y10S 427/103* (2013.01)

(58) Field of Classification Search
CPC .................. C08G 59/18; C08L 63/00
USPC ............................ 523/400, 440, 468
See application file for complete search history.

(56) References Cited

U.S. PATENT DOCUMENTS

| | | | |
|---|---|---|---|
| 4,242,106 A * | 12/1980 | Morelock | 51/307 |
| 4,381,271 A * | 4/1983 | Hayden | 264/295 |
| 4,960,643 A | 10/1990 | Lemelson | |
| RE33,767 E | 12/1991 | Christini et al. | |
| 5,158,695 A | 10/1992 | Yashchenko et al. | |
| 5,614,477 A | 3/1997 | Kompan et al. | |
| 5,695,847 A * | 12/1997 | Browne | 428/112 |
| 6,110,594 A | 8/2000 | Pinneo | |
| 6,431,758 B1 | 8/2002 | Lyon et al. | |
| 6,783,745 B1 * | 8/2004 | Voronov et al. | 423/446 |
| 7,569,176 B2 | 8/2009 | Pope et al. | |
| 2002/0137872 A1 * | 9/2002 | Schneider et al. | 528/44 |
| 2005/0186104 A1 * | 8/2005 | Kear et al. | 419/11 |
| 2008/0070815 A1 | 3/2008 | Kamada et al. | |
| 2008/0160302 A1 | 7/2008 | Asrar et al. | |

FOREIGN PATENT DOCUMENTS

| | | | |
|---|---|---|---|
| JP | 2005028802 A * | 2/2005 | |
| WO | WO 9918030 A2 * | 4/1999 | |

\* cited by examiner

*Primary Examiner* — Randy Gulakowski
*Assistant Examiner* — Ha S Nguyen
(74) *Attorney, Agent, or Firm* — Robert H. Earp, III

(57) ABSTRACT

Systems, methods, and articles of manufacture related to composite materials are discussed herein. These materials can be based on a mixture of diamond particles with a matrix and fibers or fabrics. The matrix can be formed into the composite material through optional pressurization and via heat treatment. These materials display exceptionally low friction coefficient and superior wear resistance in extreme environments.

13 Claims, 17 Drawing Sheets

RAMAN SPECTRAL DATA FOR THREE CARBON MATERIALS: DIAMONITE-B, GRAPHITE MATERIAL AND DIAMOND MATERIAL, AND FOR CARBON BLACK PRECURSORS TO DIAMONITE-A AND DIAMONITE-B

| Carbon material | Peak region | Region range from $1/\lambda_1$ to $1/\lambda_2$ (cm$^{-1}$) | Maximum $1/\lambda_{ij}$ (cm$^{-1}$) | Integrated band intensity (I) ratio | Remarks |
|---|---|---|---|---|---|
| Carbon ceramic (Diamonite-B) | 1st order region | 985 to 1800 | (i,j)[a] | | |
| | | | (1,1) 1353 | | Broad |
| | | | (1,2) 1576 | $I_{12}/I_{11}=0.51$ | Broad |
| | 2nd order region | 2315 to 3338 | (2,1) 2877 | | Exact peak location unidentifiable |
| Graphite ceramic | 1st order region | 985 to 1800 | | | |
| | | | (1,1) 1345 | | Narrow |
| | | | (1,2) 1573 | $I_{12}/I_{11}=3.4$ | Narrow |
| | 2nd order region | 2315 to 3338 | (2,1) 2455 | | Narrow |
| | | | (2,2) 2701 | | Narrow |
| | | | (2,3) 2942 | | Narrow |
| | | | (2,4) 3244 | | Narrow |
| Pyrolytic graphite (commercial grade) | 1st order region | 985 to 1800 | | $I_{12}/I_{11}=>11$ | |
| | | | (1,1) 1352 | | Narrow |
| | | | (1,20) 1579 | | Narrow |
| Diamond ceramic[b] | Fluorescence | 400 to 1800 | (fl) 1310 | | Very broad |
| | Raman | 985 to 1800 | 1338 | | Very narrow |
| Precursor for Diamonite-B (mixed Fullerenes and Nanotubes) | 1st order region halo | 985 to 1800 | (1,1) 1172 | | All peaks are narrow and superimposed onto a very broad halo |
| | | | (1,2) 1217 | | |
| | | | (1,3) 1322 | | |
| | | | (1,4) 1356 | | |
| | | | (1,5) 1429 | | |
| | | | (1,6) 1454 | | |
| | | | (1,7) 1500 | | |
| | | | (1,8) 1554 | | |
| | | | (1,9) 1600 | | |
| Carbon ceramic (Diamonite-A) | 1st order region | 985 to 1800 | (1,1) 1385 | | Broad |
| | | | (1,2) 1577 | $I_{12}/I_{11}=0.47$ | Broad |
| | | | | | Broad |
| | 2nd order region | 2577 to 3115 | (2,1) 2865 | | |
| Precursor for Diamonite-A (fullerene C$_{60}$) | 1st order region | 985 to 1800 | (1,1) 1419 | | Narrow |
| | | | (1,2) 1460 | | Narrow |
| | | | (1,3) 1572 | | Narrow |

[a]Where "i" designates region and "j" designates peak number in that region.
[b]Raman data acquired with 785 nm laser stimulation.

FIG. 3

MAIN MACROSCOPIC PROPERTIES OF NEW CARBON MATERIAL
IN COMPARISION WITH GRAPHITE MATERIAL AND DIAMOND
MATERIAL AT AMBIENT PRESSURE AND TEMPERATURE

| Carbon Ceramic | Apparent density, g/cm$^3$ | Hardness on Mohs scale | Hardness on Vickers scale, HV1, GPa | Hardness on Shore D-scale | Resistivity, μohm·cm | Thermal conductivity W/(m·K) | Thermal expansion, 10$^{-6}$ K$^{-1}$, (300 to 500 K range) |
|---|---|---|---|---|---|---|---|
| Diamonite-B | 1.76 | 8.5 | 11.5 | -- | 20600 | 2.1 | 2.8 |
| Graphite | 1.75 | 1.5 | -- | 75 | 1120 | 116 | 3.8 |
| Diamond | 3.29 | 10 | 75 | -- | >10$^{+12}$ | 400 | 1.0 |

$^a$Thermal expension is measured in 300 to 500 K range.
$^b$Samples of new carbon ceramic, Diamonite-B, graphite ceramic and diamond ceramic were fabricated as it was described in the Specification

FIG. 10A

VICKERS HARDNESS DATA FOR ETALON HARDENED STEEL
(ASAHI 72553) AND DIAMONITE-B SINTERED AT P=1 GPA

| Vickers scale | ASAHI 72553 | | Diamonite-B | |
|---|---|---|---|---|
| | $H_v^a$ (GPa) | $H_v^b$ (GPa) | $H_v^a$ (GPa) | $H_v^b$ (GPa) |
| HV0.1 | 7.3 | 7.8 | 20.6 | 18.8 |
| HV0.2 | 7.3 | 7.7 | 21.3 | 20.9 |
| HV0.3 | 7.6 | 7.7 | 13.8 | 16.1 |
| HV0.5 | 7.8 | 7.5 | 19.1 | 16.2 |
| HV1 | 7.6 | 7.4 | 11.5 | 12.4 |

$^a$Based on the measurement of the side dimension of the pyramid indent.
$^b$Based on the measurement of the diagonal dimension of the pyramid indent.

FIG. 10B

DIAMOND-DISPERSED FIBER-REINFORCED COMPOSITE FOR SUPERIOR FRICTION AND WEAR PROPERTIES IN EXTREME ENVIRONMENTS AND METHOD FOR FABRICATING THE SAME

CROSS-REFERENCE TO RELATED APPLICATIONS

This application claims the benefit of U.S. Provisional Patent application Ser. No. 61/444,168 entitled "METHOD FOR FABRICATING DIAMOND-DISPERSED FIBER-REINFORCED COMPOSITE COATING ON LOW TEMPERATURE SLIDING THRUST BEARING INTERFACES" and filed Feb. 18, 2011. The entirety of the above-noted application is incorporated by reference herein.

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

FIELD OF THE INNOVATION

The subject innovation relates to composite coating, and more particularly, diamond-dispersed organic matrix bonded and fiber reinforced composite coating. Preferably this coating can be used on sliding thrust bearing surfaces at low and cryogenic temperatures.

BACKGROUND

Fiber reinforced composites include a class of composite materials that are specifically designed to exhibit superior properties such as resistance to fracture and reliability. Examples of such composites are 1-D, 2-D, 3-D and multidirectional carbon fiber/carbon matrix (C/C) composites and also carbon fiber reinforced, organic fiber reinforced, glassy (or silica, or alumina) fiber reinforced, silicon carbide fiber reinforced composites with carbon, or organic, or metallic matrix. These composites are soft and cannot resist wear in sliding bearing applications, particularly if hard particles like sand or dust are present. Diamond exhibits high hardness and wear resistance suitable for broad applications such as cutting tools, mining tools for coals, ores and rocks, and drilling tools for oil, but fracture toughness of diamond is low and the cost of large diamonds is high, which makes its application not always economical. These factors greatly affect the overall cost and complexity in making large area diamond sliding bearings.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

In aspects, the subject innovation includes a method for making a diamond dispersed fiber reinforced composite coating that is more cost effective and simpler to implement than conventional coatings. Various embodiments of the subject innovation include methods for making wear resistant and fracture tough coating at low cost while maintaining high hardness, toughness and wear resistance. Additionally, aspects of the subject innovation can encompass methods for the coating of bearing interfaces for application in the lunar environment that includes low temperature, vacuum and presence of dust. Applications of these innovation composite coatings and methods include, but are not limited to, protective coatings, sliding bearings, and wear parts.

The subject innovation relates generally to a method for the making a diamond-dispersed fiber reinforced composite coating. The composite coating produced by the method of the subject innovation exhibits desirable properties, including high hardness, superior wear resistance, good fracture toughness, while being simpler and more cost efficient to fabricate than prior art coatings of similar properties. The method of the subject innovation have been found to afford considerable flexibility in tailoring the properties of the resulting composite coating suitable to meet a range of performance requirements for lightweight low temperature sliding trust bearing applications. The method of the subject innovation utilizes existing materials and commercially available equipment, and reduces the time and cost needed for production. The composite coating of the subject innovation is fabricated from a mixture of diamond particles and organic chemicals. Fibers or fabrics are placed on a bearing surface. Diamond particles are mixed with resin and hardener components of epoxy glue. Prior to curing, the mixture can be pressed together at room temperature. Fibers and mixture undergoes heat treatment at ambient pressure and at elevated temperatures for a predetermined holding time. While maintaining the pressure and temperature, the composite viscous matrix is hardened. In one aspect, the composition of the coating can be diamond-organic fibers-organic matrix. Fibers may be selected from the group consisting of carbon fibers, organic fibers, glassy fibers, silica fibers, alumina fibers, metallic wires or fibers, and silicon carbide fibers. The matrix may be selected from the group consisting of organic matrix, carbon matrix, metallic alloy matrix. Diamond particles may be selected from mono-crystal grains, poly-crystal grains or mixtures thereof. In one aspect of the subject innovation, there is provided a method of making a diamond dispersed-organic fiber reinforced-organic matrix bonded composite coating, which comprises the steps of: mixing diamond particles and liquid organic chemicals consisting of hardener and resin organic compounds to yield a mixture, placing fibers (or fabrics) on bearing surface, placing the mixture on bearing surface; pressing the mixture under a pressure of less than 100 MPa and at room temperature to yield the dense preform; and curing at ambient pressure and temperature of less than 200° C. for a sufficient time to yield the composite coating. In another aspect of the subject innovation, there is provided a composite coated bearing surface produced by the method above.

To accomplish the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

BRIEF DESCRIPTION OF THE DRAWINGS

FIG. 3 shows Raman spectral data for multiple carbon materials.

FIG. 10A lists the macroscopic properties of a Diamonite-B sample, prepared as described herein, compared with samples of synthetic graphite and diamond materials.

FIG. 10B shows hardness data on the Vickers scale for Diamonite-B and etalon hardened steel (ASAHI 72553).

DETAILED DESCRIPTION

Figure 1:
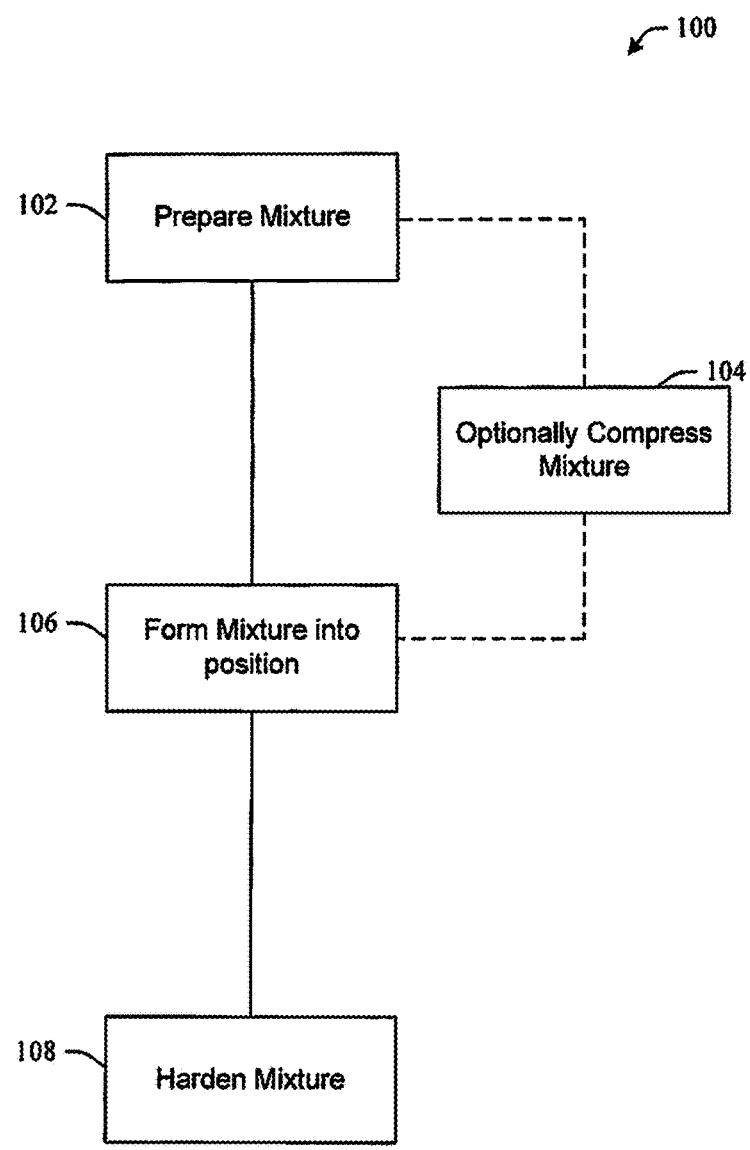
FIG. 1 illustrates a flowchart of a method 100 of manufacturing a composite material in accordance with aspects of the subject innovation.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

In aspects, the innovation includes systems, articles of manufacture, and methods of making solid parts and composite coatings, such as diamond-dispersed organic matrix bonded and fiber reinforced composite coatings and materials. Coatings or parts of the subject innovation can be used (e.g., as protective coatings, for sliding bearings such as sliding thrust bearing surfaces, on other parts that may be subjected to wear, etc.) in a range of environmental conditions, such as at low and cryogenic temperatures, or in extremely dusty environments. Embodiments of the subject innovation provide methods of making a diamond composite coating or part that is more cost effective and simpler to implement than conventional methods. In aspects, materials of the subject innovation can include wear and fracture resistant parts and coatings, and can be manufactured at low cost while maintaining high hardness, toughness and wear resistance. In other aspects, the innovation can include a method for coating bearing interfaces that has applications in a lunar or similar environment that includes low temperature, vacuum and presence of dust, or in other dusty environments with a need for improved parts, such as geographic locations that are primarily arid or desert, as in Iraq or Afghanistan. Systems, articles of manufacture, and methods of the subject innovation include techniques to produce large parts in near net shape thus lowering machining costs associated with producing extremely hard, durable parts from materials that also resist machining into the desired shape. Applications of these innovative composite materials and coatings include, but are not limited to, protective coatings, sliding bearings, wear parts, etc.

In various embodiments, the innovation can include a method of making a diamond particle-dispersed fiber reinforced plastic matrix-bonded composite coating or solid part, which can include the steps of mixing diamond particles with one or more liquid organic compounds to form a mixture and placing the mixture onto a substrate (e.g., metallic, ceramic, polymeric or composite, for example, a carbon fiber/carbon matrix (C/C) composite, etc.). The method can also include the steps of compressing the mixture under a pressure (e.g., of less than 100 MPa) at room temperature and heat treating the mixture at ambient pressure and an elevated temperature (e.g., less than 700° C.) for a sufficient time to yield the composite coating or solid part. Composite coatings or solid parts associated with aspects of the subject innovation can be used in a variety of applications. In one example, a composite coating of a sliding thrust bearing interface useable in dusty environments can be manufactured, as discussed herein.

In various embodiments, the subject innovation includes one or more monolithic carbon materials described herein, such as the lines of fullerene- and nanotube-based materials discussed herein. Experimental results discussed herein show that these carbon materials are neither graphite-like nor diamond-like carbon. These various pure carbon materials will be referred hereafter as "Diamonites," and are monolithic carbon materials synthesized (e.g., by sintering, polymerization, etc.) at least in part from fullerene precursors. Example Diamonites made from various precursors are the following: Diamonite-A is polymerized under high pressure from fullerene $C_{60}$ powder precursor; Diamonite-B is derived from "mixed fullerenes" powder; Diamonite-C is a composite carbon-carbon material synthesized under pressure from mixed fullerenes and diamond powders; and Diamonite-D is a composite carbon-carbon material synthesized from mixed fullerenes and graphitic powders or fibers. "Mixed fullerenes" powder is a commercially available product containing a mixture of various fullerenes.

In view of the aspects and features described, methodologies that may be implemented in accordance with embodiments of the subject innovation will be better appreciated with reference to the figures. While for purposes of simplicity of explanation, the methodologies are shown and described as a series of drawings representing steps or acts associated with the methodologies, it is to be understood and appreciated that the claimed subject matter is not limited by the order of the drawings, as some drawings may occur concurrently with other drawings and/or in different orders than what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated drawings may be required to implement the methodologies described hereinafter.

Turning to FIG. 1, shown is a flowchart of a method 100 of manufacturing a composite material (e.g., for use as a part or coating, etc.) in accordance with aspects of the subject innovation. In step 102, a mixture of a matrix (e.g., organic chemicals, etc.) and carbon particles (e.g., diamond particles, or precursor materials such as fullerenes, nanotubes, etc.) can be prepared, and fibers can be included in the mixture. Preparation of the mixture can include not just mixing, but also selection of one or more criteria associated with the mixture, as described further herein, such as selection of fibers, selection of particles, or selection of matrix. Optionally, in embodiments comprising diamond particles, diamond grains of different sizes can be used, as described further herein. Additionally, in some embodiments, the mixture may be optionally pressed together or compressed at room temperature at step 104 to increase density of the coating, part, etc. For example, in this optional step the fibers and mixture can be placed on a bearing surface and pressed together under a pressure of around 1 MPa or more to around 100 MPa or less and it can be done at room temperature (i.e., around 18° C. to 28° C.) to produce a dense mixture. The fibers and mixture can then be formed, placed or arranged into position at step 106 (e.g., into a final or near final position or shape), such as by being placed on the surface of a part (e.g., a bearing, etc., if the material will be a coating) or being placed in a mold or form (if the material will be a part). In a coating example, the mixture can be placed onto a metallic, ceramic or composite (e.g., C/C composite) substrate, and then hardened for sufficient time to yield a composite coating. At step 108, the mixture can be hardened, for example by undergoing heat treatment (or curing, or polymerization, or hardening) at ambient pressure and at elevated temperatures for a predetermined time, such as a holding time during which the temperature and pressure are maintained. For example, in some embodiments, the mixture can undergo a heat treatment at ambient pressure (i.e., 900 hPa to 1100 hPa), and at temperatures from more than around 20° C. to less than around 200° C. for a predetermined holding time of about 1 to 24 hours to be hardened.

In some embodiments of the subject innovation, the matrix can be an organic matrix comprising organic compounds that can include at least one of a liquid viscous resin or hardener component of an epoxy, or other polymeric (or olygomeric) material. Alternatively, the matrix can be a carbon matrix such as those of precursor materials or other materials disclosed herein, or can be a metal matrix, etc. In various aspects, the fibers can be one or more of organic fibers, carbon fibers, glassy fibers, silica fibers, alumina fibers, silicon carbide fibers, combinations thereof, or other fibers, or wires, including metallic and non-metallic wires. Additionally, although the term "fiber" is used herein, it is intended to encompass other similar materials, including fabrics composed of fibers and portions thereof, etc. Additionally, in diamond embodiments, the diamond particles can include one or more of monocrystalline diamond grains, polycrystalline diamond grains, or combinations thereof. The average grain sizes of the carbon or diamond particles can be at least approximately 1 µm, and in some embodiments can be approximately 1000 µm or more (e.g., in a range of around 400 to around 600 µm). In other embodiments, mixtures of sizes can be selected. For example, mixtures of various sizes, such as around 500 µm (e.g., in a range of around 400 to around 600 µm), around 50 µm (e.g., in a range of around 40 to around 60 µm), around 5 µm (e.g., in a range of around 3 to around 7 µm), or other sizes, as would be understood in light of the teachings herein. The various sizes can be mixed in substantially any ratios, including but not limited to: around 500 µm at around 75% by weight with around 50 µm at around 25% by weight; around 500 µm at around 75% by weight with around 5 µm at around 25% by weight; around 500 µm at around 68% by weight with around 50 µm at around 23% by weight and around 5 µm at around 9% by weight.

In various embodiments, the volume fractions of the constituent phases of carbon (e.g., diamond, etc.) particles and organic matrix (binder) respectively, can vary. In various embodiments, for example, the carbon (e.g., diamond) volume fraction can be any percentage (e.g., 0% to 100%), and can be in a range of around 30% or more volume fraction to around 75% or less. In various experiments, mixtures with 34%, 44%, 52%, 56%, 63%, 67%, and 72% were used, with varying properties as discussed herein, although other percentages can be used, as will be understood in the art. The carbon or diamond particles can be incorporated into the present composite coating to provide higher hardness, while the fibers and binder matrix can be incorporated to provide higher fracture toughness. In this manner, the pressure, temperature, time and concentration of the components can be adjusted to achieve variable properties and performance. Increasing the volume fraction of carbon or diamond particles can enhance the hardness of composite coating, while increasing the volume fraction of binder matrix can enhance the crack or fracture resistance of the composite coating.

In various embodiments, the innovation can include a method of fabricating a diamond-dispersed fiber reinforced composite material or coating. The composite surface produced by this method exhibits desirable properties, including high hardness, superior wear resistance, good fracture toughness, and excellent non-lubricated friction properties while being simpler and more cost efficient to fabricate than conventional coatings and parts. Such a method can afford considerable flexibility in tailoring the properties of the resulting composite or coating, suitable to meet a range of performance requirements for lightweight low temperature and/or dusty environment sliding thrust bearing applications. Methods of the subject innovation can utilize existing materials and commercially available equipment, and can reduce the time and cost needed for production.

In other aspects, the subject innovation can include a composite material, such as can be made by method 100. Alternatively or additionally, the innovation can comprise one or more monolithic carbon materials synthesized (e.g., by sintering, polymerization, etc.) at least in part from fullerene precursors, such as those disclosed herein.

In other aspects, the innovation can include a C/C-composite material (e.g., useable as a bearing insert, for thermal protection of re-entry vehicles or for rocket nozzles, etc.), and method of fabricating the same. This material can be made by infiltration of a carbon (C)-fiber preform with melted pitch or by mixing chopped-C fibers with melted pitch, followed by pressure assisted polymerization (PAP) to transform the pitch into a strong C-matrix. The PAP procedure can be performed at 10-100 MPa and 20-700° C. Optional heat treatment in vacuum at 700-2000° C. may be performed to increase the stability of the C/C composite at high temperatures. This low cost, lightweight (1.7-1.9 g/cm$^3$) C/C composite may be used in low temperature (e.g., Earth, Moon, Mars, etc.) and in high temperature (e.g., Venus, etc.) environments.

Further aspects of the subject innovation include a silicon carbide (SiC) material (e.g., useable as a coating, part, etc. in a variety of applications, such as long-term multi-cycle Earth atmosphere applications, etc.) reinforced with C and/or SiC fibers and/or fabric, and methods of making the same. For coating embodiments, the colloid precursor can be deposited by painting with a brush onto a surface of C/C composite insert with further heat treatment in a furnace in ambient air atmosphere. The SiC coating can be formed by high temperature reaction of a colloidal precursor with the C/C composite. Due to the matching of the thermal expansion coefficients of the composite substrate and composite coating over a wide temperature range, the SiC layer can prevent oxidation of C substrates. Such C/C-C/SiC and C/C-SiC/SiC composites may be used for bearing, thermal protection and nozzle components, and can also be used for high-temperature applications in lightweight gas-turbine engine components, as well as other applications.

In other embodiments, the innovation can include methods for fabricating a diamond (D) particle reinforced fullerene/nanotube derived C-matrix (D/C) composite or the resulting composite (called Diamonite-C). This composite can be used in a variety of applications, such as bearing inserts, substrates, etc. Diamond is a well known form of carbon. Such a method can include the mixing of diamond powders with "mixed fullerenes and nanotubes" carbon black (MF) and PAP of MFs to form the C-matrix (called Diamonite-B, and described in greater detail herein) of the D/C composite. This composite (Diamonite-C) is a new carbon material, due to the Diamonite-B matrix (described further herein) that is neither the graphite-like nor the diamond-like forms of carbon that were previously known. Diamonite-B is both very hard and resilient, a superhard elastomer. The PAP procedure can be performed in the 10-1000 MPa pressure range and the 20-700° C. temperature range. The matrix of the D/C composite is a high temperature polymer that can be used in the 300-500° C. temperature range in air and in the 300-1500° C. temperature range in vacuum, unlike conventional materials, none of which can operate in these ranges. This material can be used (e.g., as a composite bearing insert, etc.) in low temperature (e.g., Earth, Moon, Mars environments, etc.) and high temperature (e.g., Venus, etc.) environments.

What follows is a more detailed discussion of certain systems, articles of manufacture, and methods associated with aspects of the subject innovation. To aid in the understanding of aspects of the subject innovation, theoretical analysis and experimental results associated with specific experiments that were conducted are discussed herein. However, although for the purposes of obtaining the results discussed herein (e.g., material properties, etc.), specific choices were made as to the selection of various aspects of the experiments and associated setups—such as choice of materials, fabrication methods, as well as other aspects—the systems, articles of manufacture, and methods described herein can be employed in other contexts, as well. For example, aspects of the subject innovation can be utilized as coatings over a surface, or one or more portions thereof. In various aspects, however, the subject innovation can use materials, parts, and coatings that can differ from those used in the experiments discussed herein, and may have differing characteristics, properties, etc., as explained in greater detail herein.

In experiments discussed herein, samples of novel carbon materials, referred to as Diamonites, were fabricated, and properties of Diamonites were investigated. For example, samples of one material discussed herein (Diamonite-B) were fabricated under high pressure from a commercially available carbon black identified as mixed fullerenes. This novel material (and other Diamonites) is neither graphite-like nor diamond-like, but exhibit electrical properties close to graphite and mechanical properties close to diamond. In various experiments discussed herein, Raman spectroscopy was used to investigate the vibrational dynamics of the novel carbon materials and to provide structural characterization of their short-, medium- and long-range order. Additional experiments discussed herein investigated these samples by high-resolution electron microscopy and X-ray diffraction (XRD). In further experiments discussed below, the hardness, electrical conductivity, thermal conductivity and other properties of these materials were compared with synthetic graphite-like and diamond-like polycrystalline materials, two other phases of synthetic monolithic carbon.

Raman scattering is an informative technique for studying carbon materials because each distinct form of carbon has a unique Raman spectrum. In particular, Raman spectroscopy has proven to be extremely sensitive to short, -medium, -and long-range order in solid carbon and has become a standard technique in characterizing carbon materials.

The temperature-pressure state diagram of carbon is not well developed, since carbon has the highest melting and boiling temperatures of all the elements. For example, the critical parameters ($P_{cr}$, $T_{cr}$, $V_{cr}$) of carbon are unknown. There is data regarding the triple point, which is located in the pressure range that exceeds atmospheric pressure ($P_{tr}$~10 MPa), indicating that carbon materials sublimate at ambient pressure without melting. Novel monolithic carbon materials have been developed, such as the lines of fullerene- and nanotube-based materials discussed herein. Experimental results discussed herein show that these carbon materials are neither graphite-like nor diamond-like carbon. These various pure carbon materials will be referred hereafter as "Diamonites." Example Diamonites made from various precursors are the following: Diamonite-A is polymerized under high pressure from fullerene $C_{60}$ powder precursor; Diamonite-B is derived from "mixed fullerenes" powder; Diamonite-C is a composite carbon-carbon material synthesized under pressure from mixed fullerenes and diamond powders; and Diamonite-D is a composite carbon-carbon material synthesized from mixed fullerenes and graphitic powders or fibers. "Mixed fullerenes" powder is a commercially available product containing a mixture of various fullerenes.

Various Diamonites have different properties, and can be used for applications discussed herein. Diamonites are novel synthetic high-hardness carbon materials with several desirable properties. Diamonite-A and -B are formed by high-pressure high-temperature consolidation of different types of carbon black; Diamonite-C and -D include, respectively, diamond powder and graphitic powder or fibers. Diamonites are pure carbon materials, but they can also be doped with hydrogen, boron, or nitrogen for electronic applications. Diamonites are much harder and tougher than carbon-graphitic materials, and have properties lending to numerous applications. For example, Diamonite-B has the same extremely high energy and temperature of sublimation as any graphitic carbon material, making it useful in a wide range of engineering applications. Development of novel Diamonites using carbon black or soot (potentially with diamond or graphite powder or fibers included) can result in interesting mechanical and electrical properties, in combination with high hardness and high toughness. For example, the Diamonite-B material can be readily polished to a high-level mirror quality finish with unusual optical properties.

Raman scattering experiments discussed herein were used in identifying and understanding the Raman signatures of novel carbon materials, such as the Diamonites. Additionally, methods of sample fabrication for various monolithic carbon materials are discussed below, although aspects the particular methods described in connection with the experiments can be varied as would be understood in light of the discussion herein, and such variations are intended to be considered within the scope of the disclosure. Results provided herein also include comparisons of Raman spectroscopy of the mixed fullerene derived material sample to those of graphitic material and pure diamond material also sintered as part of the experiments. The results of Raman spectra from the surfaces of novel carbon materials and synthetic graphite and diamond materials are summarized along with their key physical properties.

In a first experiment, samples of graphite material, diamond material and a novel carbon material, Diamonite-B, were synthesized. The Diamonite-B was synthesized under high pressure from a commercially available mixture of fullerenes ("buckyball" structures of carbon atoms, possibly containing "single-wall nanotubes with closed ends" structures) that was used as received. The graphite material was machined from industrial-grade rod. Specimens of the graphite material and Diamonite-B were approximately 9 mm in diameter and 3 mm in height while the specimen of the diamond material was approximately 7 mm in diameter and 3 mm in height. For model comparison, a sample of Diamonite-A was synthesized at the same parameters and conditions as the Diamonite-B from pure $C_{60}$ fullerene that was used as received.

A range of conditions can be used in preparing samples such as those fabricated in the below experiments. Synthesis conditions used can be at or below pressures and temperatures used for diamond production. For example, precursors can be pressed and heated using high pressure high temperature (HPHT) treatment with parameters such as pressures in a range of around 1 to around 10000 MPa, temperatures in a range of around 300 to around 1000° C., for times of around 1 second or less to around 10000 seconds or more. In some situations, precursors may need to be at least one of purified (e.g., by maintaining the precursor at an elevated temperature (e.g., at around 160-400° C.) for an extended period of time) or consolidated (e.g., by applying pressure (e.g., at around 1 MPa-500 MPa) at room temperature) prior to sintering.

The following is a summary of the preparation of Diamonites in the experiment, including the preparation of powders, agglomeration and co-agglomeration of powders, making of green bodies, high pressure synthesis, mechanical machining, and lapping or polishing of surfaces to a mirror finish. The green bodies for the Diamonites can be consolidated at 1 MPa-500 MPa at room temperature. The mixed fullerenes powder behaved quite differently from $C_{60}$ powder in cold compaction in that the mixed fullerene powder was harder and needed more careful handling.

The mixed fullerenes powder was milled and compacted in a steel die at room temperature under a pressure of 500 MPa. The resulting green body was very soft, non-conductive, and had an apparent density of 1.57 g/cm$^3$. The green body was sintered at P=1000 MPa and T=600° C., with holding time of 15 min. in order to produce Diamonite-B. The samples of Diamonite-B and Diamonite-A fabricated using the same parameters were harder than steel, electrically conductive, and had a pitch black mirror-like cleavage surface. The samples of synthetic diamond material were sintered at P=8000 MPa and T=1600° C., with a holding time of 1 min. The grains of the initial synthetic diamond powder for synthesizing the diamond material were a monocrystalline structure approximately 50 µm in diameter; the majority of grains were in the 40 to 60 µm range. The filled density of this diamond powder was 1.91 g/cm$^3$. A High Pressure and High Temperature (HPHT) Apparatus described in the literature was used to fabricate samples. In the hydraulic unit of the apparatus a pump supplied oil to the cylinder under pressure (P*). Area (S*) of the ram cross-section multiplied by pressure in the cylinder gave the value of force, F, after deducting friction ($F_{fr}$) between the ram and cylinder:

$$F = P^* \cdot S^* - F_{fr} \qquad (1)$$

The force was applied to the HP unit, which was inserted into the frame of the press. Pressure was generated in the HP unit as the clay container was squeezed by the anvils. The pressure was generated at room temperature. Values of pressure, P, in the center of the container can be evaluated by formula (2):

$$P = \frac{F}{S + \frac{F}{H}} \qquad (2)$$

where H is micro-hardness of the working parts of the anvils (H=15 GPa for the cermet of the first modification and H=10 GPa for hardened steel in the second modification), and S is the effective area of the container.

Temperature, T, was generated by a graphite heater inside the container. Temperature can be approximated by Equation (3) if it is not too high:

$$T = T_0 + kW \qquad (3)$$

where $T_0$ is ambient temperature, W=UI is power to the heater, k is a proportionality coefficient, U is the voltage, and I is the current. Equation (3) is valid when heat dissipation is mostly by thermal conductivity. At higher temperatures, when radiation becomes important, the value of the temperature is lower than that determined from Equation (3). The dependences of pressure on force and temperature on power were carefully calibrated by known phase and state transitions, so these values could be determined with high precision.

All samples were synthesized inside industrial synthetic graphite material crucibles encased in clay containers. Synthesized monolithic samples were extracted from opened crucibles and fragments of crucibles and the clay containers were discarded. Machined samples of synthetic diamond material were boiled in perchloric acid, then in distilled water and dried. Samples of Diamonites were cleaned in acetone and dried.

Raman scattering is a useful analytical technique for analyzing the composition of materials. Specificity of spectra provides a means to determine vibrational symmetry, symmetry of molecules, or bonds in solid substances, and to identify specific molecules or solid particles in the mixture.

Figure 2:
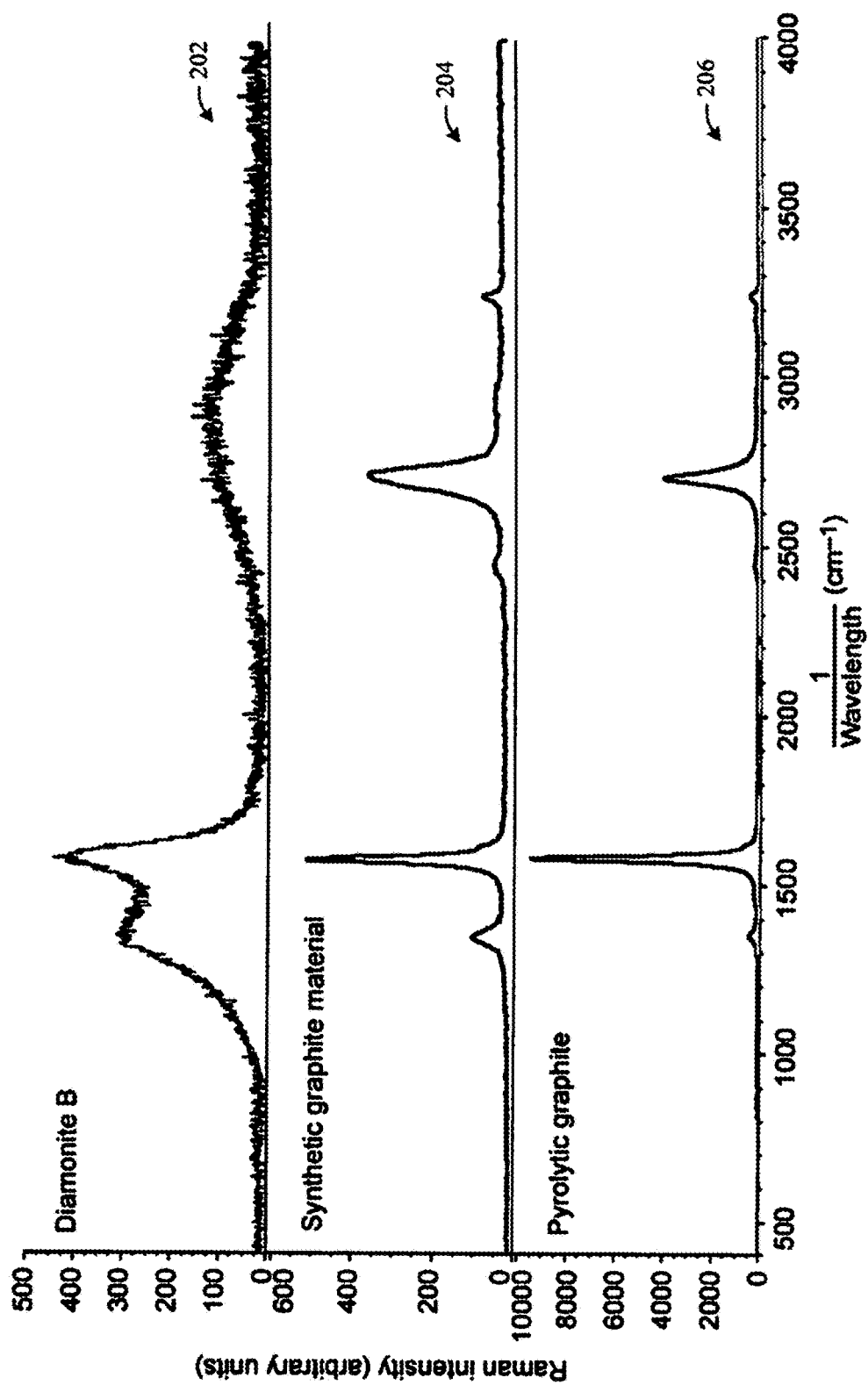
FIG. 2 shows the Raman spectra from the surface of the mixed fullerenes derived monolithic carbon nano-material and from graphite materials.

FIG. 2 shows the Raman spectra from the surface of the mixed fullerenes derived monolithic carbon nano-material (Diamonite-B) and graphite materials. Graph 202 shows the Raman spectrum from the surface of Diamonite-B. There are only three very broad peaks. For reference herein, peaks will be identified by a two digit subscript (ij) where the first digit, i, describes the region of the spectrum where the peak appears as shown in FIG. 3, which shows Raman spectral data for the carbon materials, and the second digit, j, describes the order of appearance of the peak from lower to higher inversed wavelength.

Figure 4:
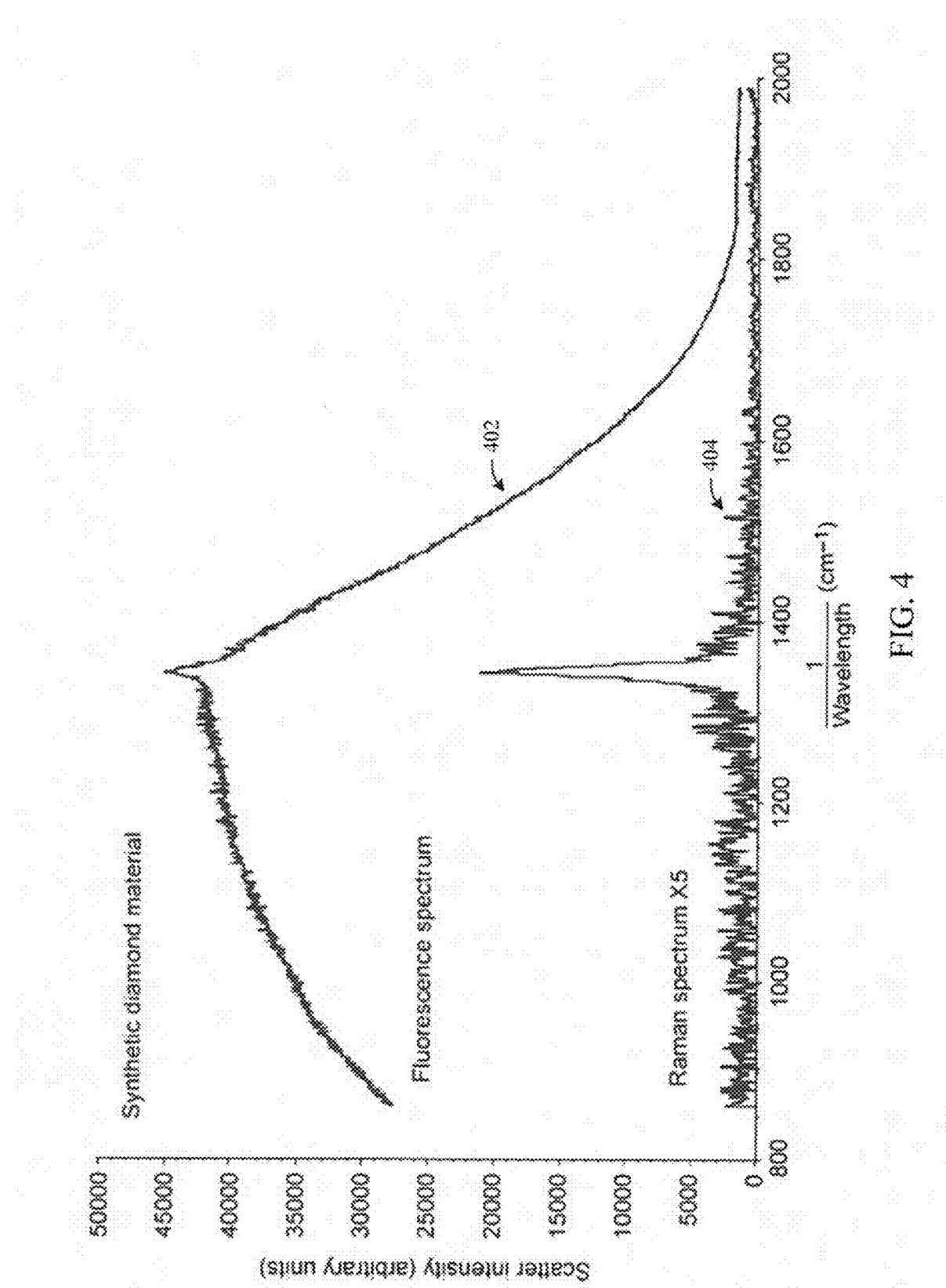
FIG. 4 shows fluorescence and Raman spectra for the diamond material.

A similar spectrum for the synthetic graphite material is shown in graph 204. FIG. 4 shows the fluorescence 402 and Raman 404 spectra for the diamond material. The Raman spectrum for the diamond material 404 was corrected for the strong fluorescence background 402. Unlike the Raman spectra of Diamonite-B and synthetic graphite material, which were easily observed by stimulation with a visible wavelength laser (green), the diamond material produced a strong fluorescence background making it difficult to obtain a spectrum. Excitation by a 785 nm red laser allowed acquisition of the spectrum in the first order region, as shown in FIG. 4.

As can be seen from the spectra in FIG. 2, the Raman scattering from the surface of the Diamonite material and graphite material were quite different and can be readily identified and compared. Strong fluorescence from the diamond material as seen in FIG. 4 made it difficult for a direct comparison of its Raman spectrum with the spectrum from the novel carbon material and the graphitic carbon materials. A summary of the Raman spectra for all three types of carbon materials can be found in FIG. 3, along with Diamonite-A and the precursor synthetic materials for reference. Diamonite-A and -B differ by their precursor powders. Diamonite-A is polymerized under high pressure using a powder precursor of fullerene $C_{60}$, Diamonite-B is derived from "mixed fullerenes" powder, where all kind and size of "buckyballs" are present, such as $C_{60}$, $C_{70}$, $C_{120}$, etc. As discussed further below, Diamonite-A precursor powder consists of very soft electrically non-conductive grains with very well ordered crystalline structure of "molecular crystals." $C_{60}$ "buckyballs" are arranged into face centered cubic lattice.

Figure 5:
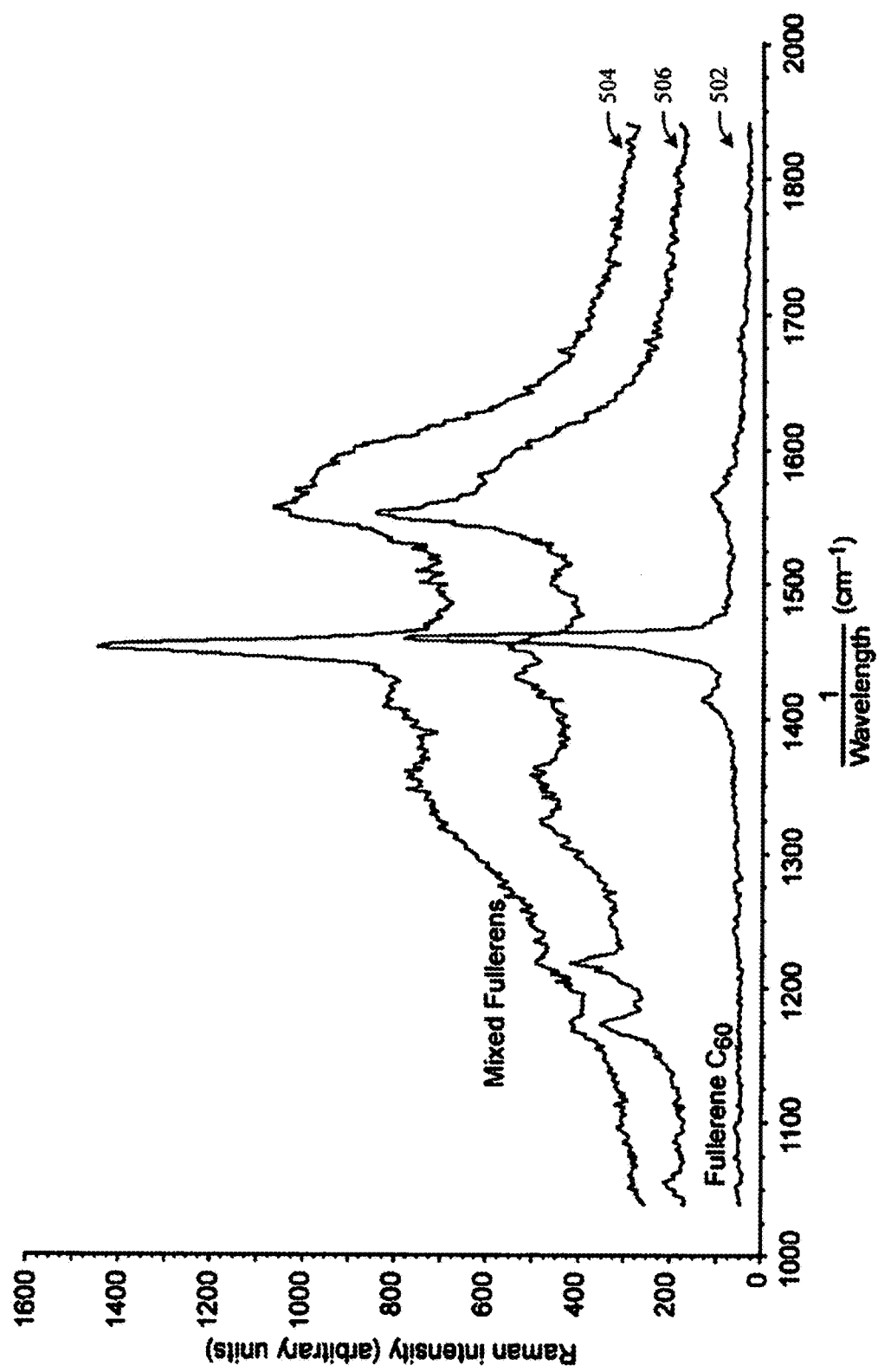
FIG. 5 shows Raman spectra for Diamonite precursor materials.

FIG. 5 shows Raman spectra for Diamonite precursor materials (the precursor powders for Diamonite-A at 502 and Diamonite-B at 504 and 506). All of the Diamonite materials had typical carbon spectra in the Raman, therefore a comparison of their spectra to those of the starting materials could be used to see if residual starting materials were present.

Figure 6:
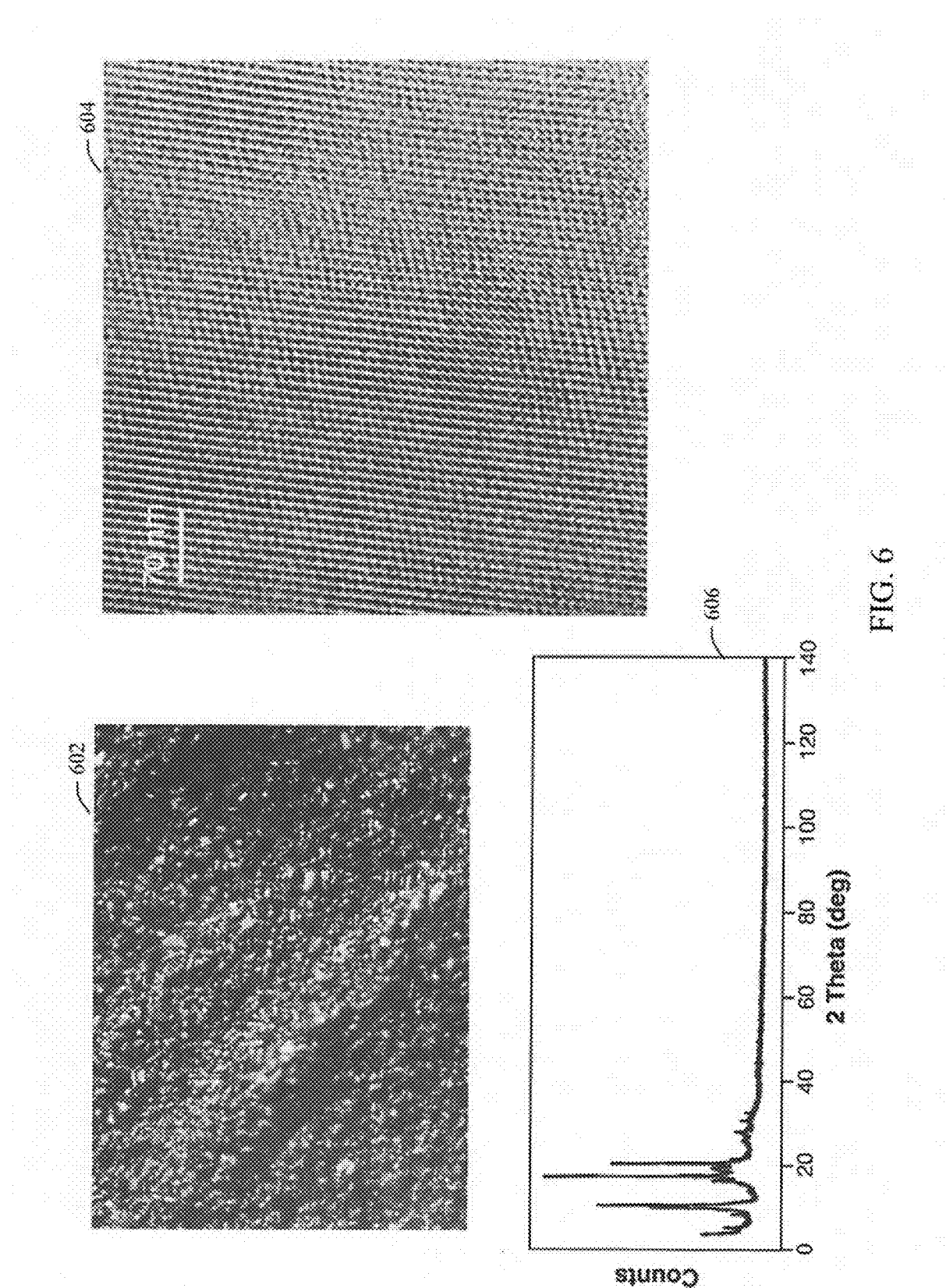
FIG. 6 shows results characterizing the mixed fullerenes precursor.
Figure 7:
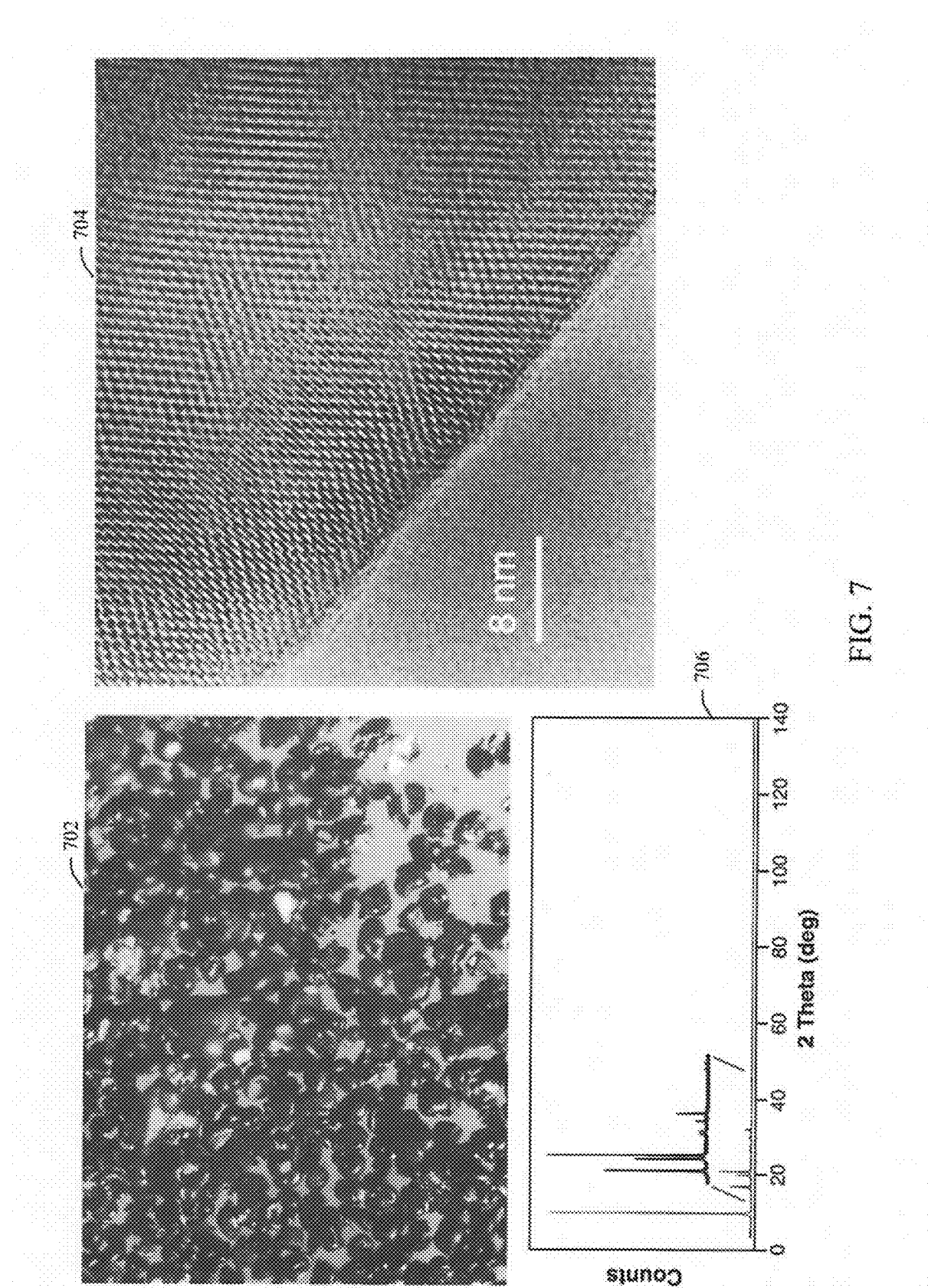
FIG. 7 shows characterization results of the $C_{60}$ precursor.

FIG. 6 shows results characterizing mixed fullerenes, the precursor for Diamonite-B. Photomicrograph 602 depicts an X30 image of the mixed fullerenes precursor powder, 604 depicts a high-resolution transmission electron microscope (HR-TEM) image of the same, and 606 shows its X-ray diffraction pattern from the K-alpha emission line of copper (CuK$_\alpha$). Similarly, FIG. 7 shows characterization results of the $C_{60}$ precursor of Diamonite-A, with an X30 photomicrograph 702, HR-TEM image 704, and X-ray diffraction pattern from CuK$_\alpha$. A HR-TEM was used to obtain crystallographic (lattice structure) information from electron diffraction; chemical composition was derived from energy dispersive x-ray analysis; chemical bond type from electron energy loss spectroscopy; and textural information from direct images. The same analysis was performed on the materials produced by HPHT processing.

Mixed fullerenes powder (as shown in FIG. 6) shows ordered zones of carbon atoms and amorphous disordered regions.

Image 702 shows a photomicrograph of fullerene $C_{60}$ that have been extracted and refined into solid grains, often referred to as fullerite, which is held together by quadrupole electrical forces to form a molecular crystal. Fullerite is a soft, well-arranged and close-packed form of $C_{60}$ (1.6 g/cm$^3$) that has some defects in its arrangement. As can be seen, this type of powder has a very well ordered structure of carbon atoms and it is quite different from the structure of mixed fullerenes.

Figure 8:
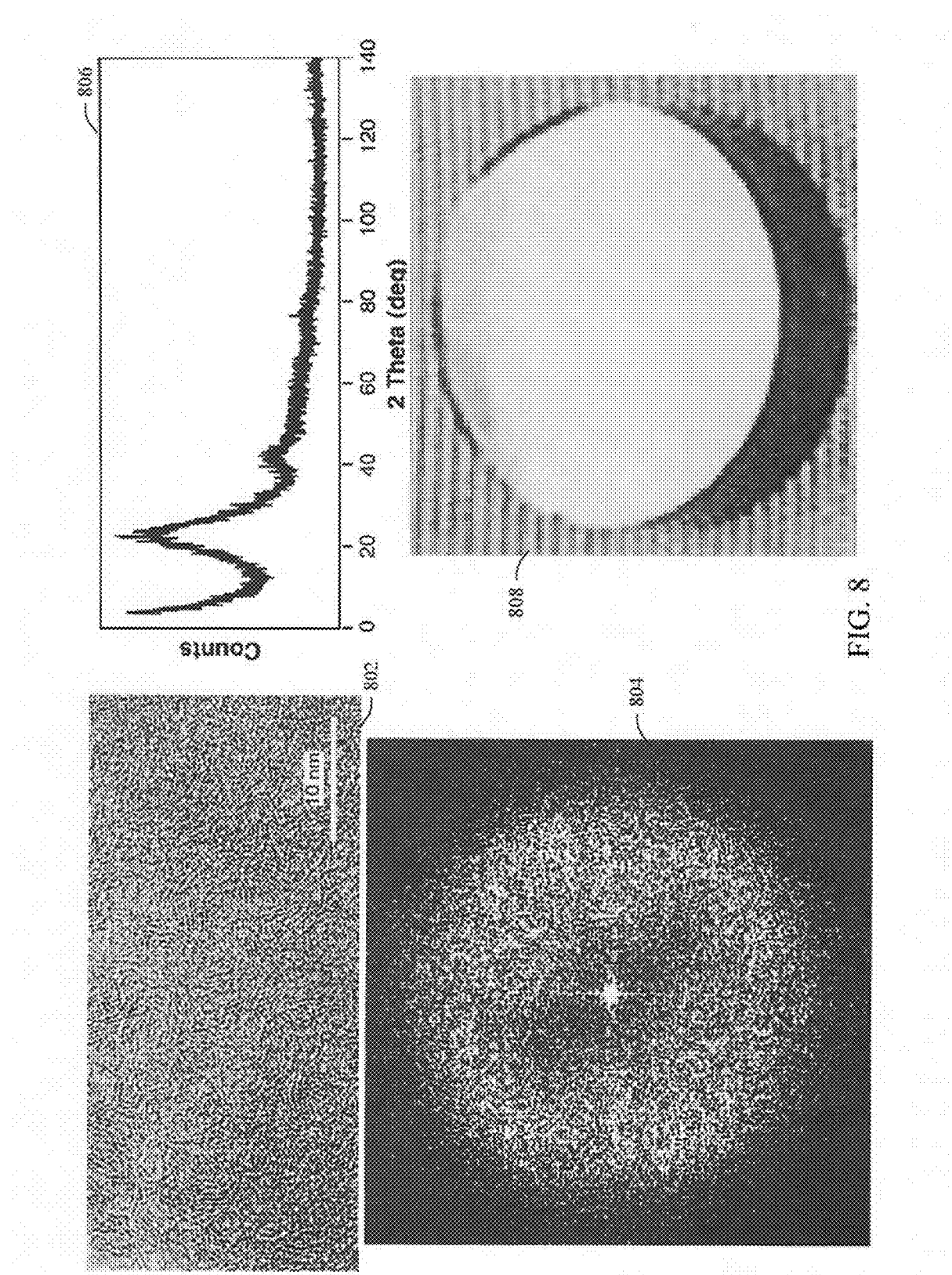
FIG. 8 shows a high resolution transmission electron microscope (HR-TEM) image of Diamonite-B, along with an electron diffraction pattern, X-ray diffraction pattern, and an image of a specimen.
Figure 9:
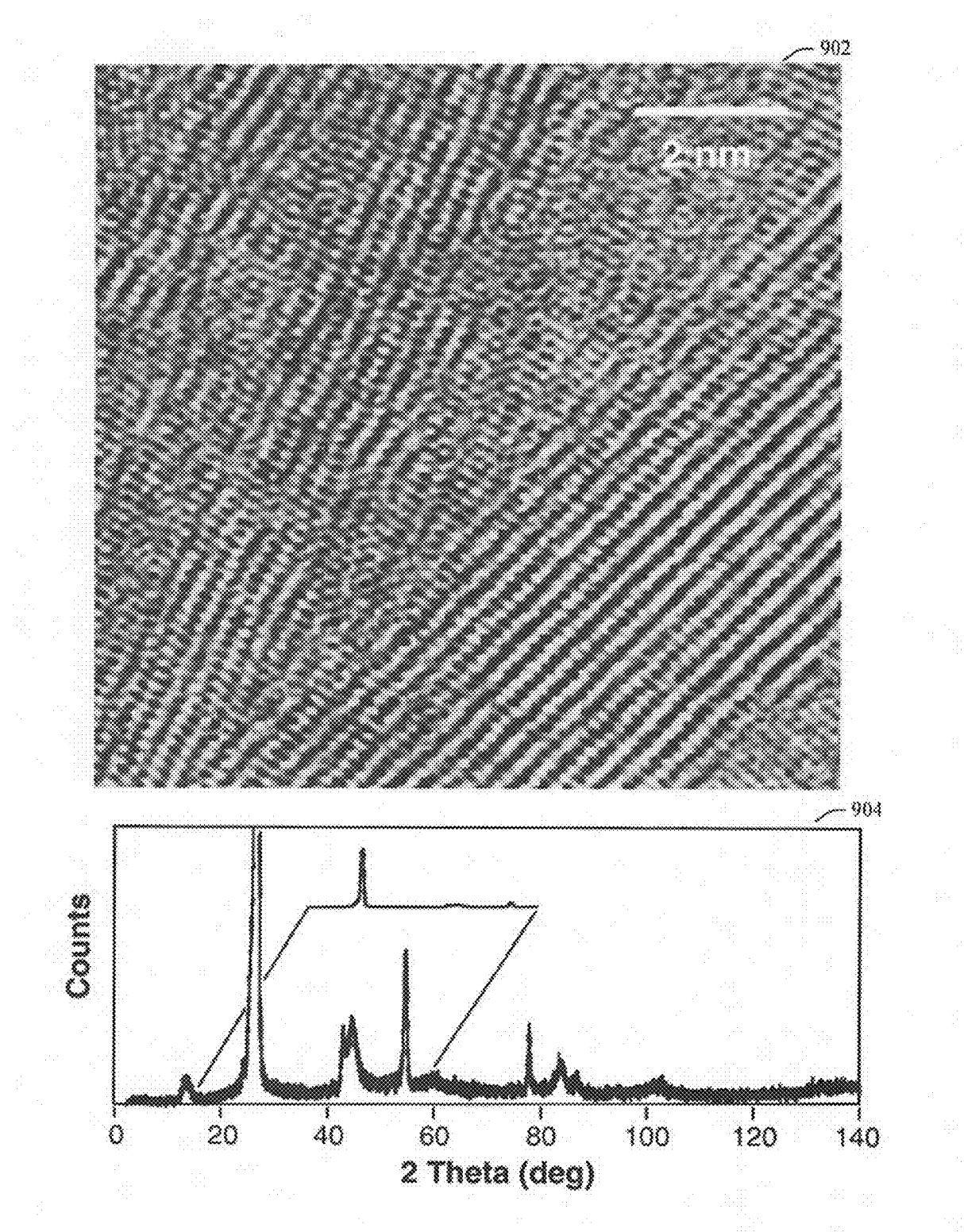
FIG. 9 shows an HR-TEM image of graphite with a corresponding X-ray diffraction pattern.

FIG. 8 shows results for Diamonite-B: an HR-TEM image 802, electron diffraction pattern 804, X-ray diffraction pattern 806, and an image 808 of a Diamonite-B specimen polished to mirror quality. FIG. 9 shows the results for a sample of industrial graphite monolithic material. Results shown in 804 and 806 indicate that the microstructure of Diamonite-B is rather amorphous, the two peaks in the x-ray diffraction pattern are low intensity and very broad, contrary to graphite material peaks that are high intensity and sharp. High resolution TEM-images also show the existence of ordered crystallite structure in graphite, as shown in FIG. 9, and the absence of medium and long-range order in this new material. This observation is further supported by the Raman data shown in FIG. 2 and leads to the conclusion that Diamonite-B consists of co-polymerized buckyballs, single-wall nanotubes and fragments of fullerene blocks inserted into the intermediate space yielding a dense, non-porous structure of carbon atoms with mixed sp$^2$-sp$^3$ hybridization and having a small crystallite size.

The synthetic graphite material of FIG. 9 was observed to have a well-arranged layered structure of carbon atoms with regions of order that are nano-sized and randomly oriented, as seen in image 902, which is consistent with the $L_a$ estimated from the Raman data. There are pores inside hexagonal layers and other defects. The X-ray diffraction pattern at 904 shows the high-intensity, sharp peaks associated with graphite as does the Raman spectrum in FIG. 2.

The samples of new carbon materials (e.g., Diamonites, etc.) can be sintered using different processing parameters: pressure (P), temperature (T), hold time at P and T, and from different mixtures of fullerenes-nanotubes in the carbon black. Macroscopic properties of such samples will be different; therefore, the anticipated range of properties is addressed briefly herein, although other variations than those of the experiment would be understood by a person of skill in the art in light of the teachings herein. Similar variations also exist in different grades of industrial graphite material, where properties depend heavily on source material, technology and manufacturer. The experimental results focused on defined values that could be measured with high precision, although other variations are possible. FIG. 10A lists the macroscopic properties of a Diamonite-B sample, prepared as described above, which were compared to the samples of synthetic graphite and diamond materials. The results shown in FIG. 10A deal with experimentally-defined values rather than ranges of properties, although it is to be understood that variations such as those described herein can be used to create materials with varying properties. The properties of the materials shown in FIG. 10A indicate many potential applications of Diamonite-B and other materials discussed herein.

From FIG. 10A, the main differences are hardness and thermal conductivity. Graphite is extremely soft whereas Diamonite-B is harder than hardened steel. Graphite is a good thermal conductor, whereas Diamonite-B is a thermal insulator. The high temperature properties are similar: thermal stability is the same, oxidation resistance in air is almost the same, although Diamonite-B oxidizes more slowly than graphite. The chemical stability, however, is quite different: graphite gradually dissolves in boiling perchloric acid, but Diamonite-B does not react, which is similar to the behavior of diamond. The color of Diamonite-B is similar to graphite, varying from gray to black. It should be noted that some references indicate the Mohs hardness of graphite is less than 1, and some graphite materials can be rated higher than 2. The hardness value presented in FIG. 10A is a result of measurements on the particular sample that was synthesized and investigated specifically for experiments discussed herein. Hardness of soft carbon-based materials like graphite and polymers is usually determined with a Durometer on the Shore scale, which is not applicable for hard materials. For hard materials, the micro hardness is determined on Vickers, Knoop, Brinell, Rockwell and other appropriate scales. For this reason, the data was presented on the Vickers scale for Diamonite-B and diamond material, and on the Shore scale for the graphite material. FIG. 10B shows hardness data on the Vickers scale for Diamonite-B and etalon hardened steel (ASAHI 72553).

Measuring hardness on the Vickers scale is performed using a diamond indentor loaded by force, F. The tip of the indentor is shaped like a square pyramid, which leaves a surface indentation (cavity) of square cross-section, where "a" is the side of the square, and the indentation size is measured with an optical microscope.

The hardness values for the etalon steel lie in the 7300 to 7800 MPa range, as shown in FIG. 10B.

Figure 11:
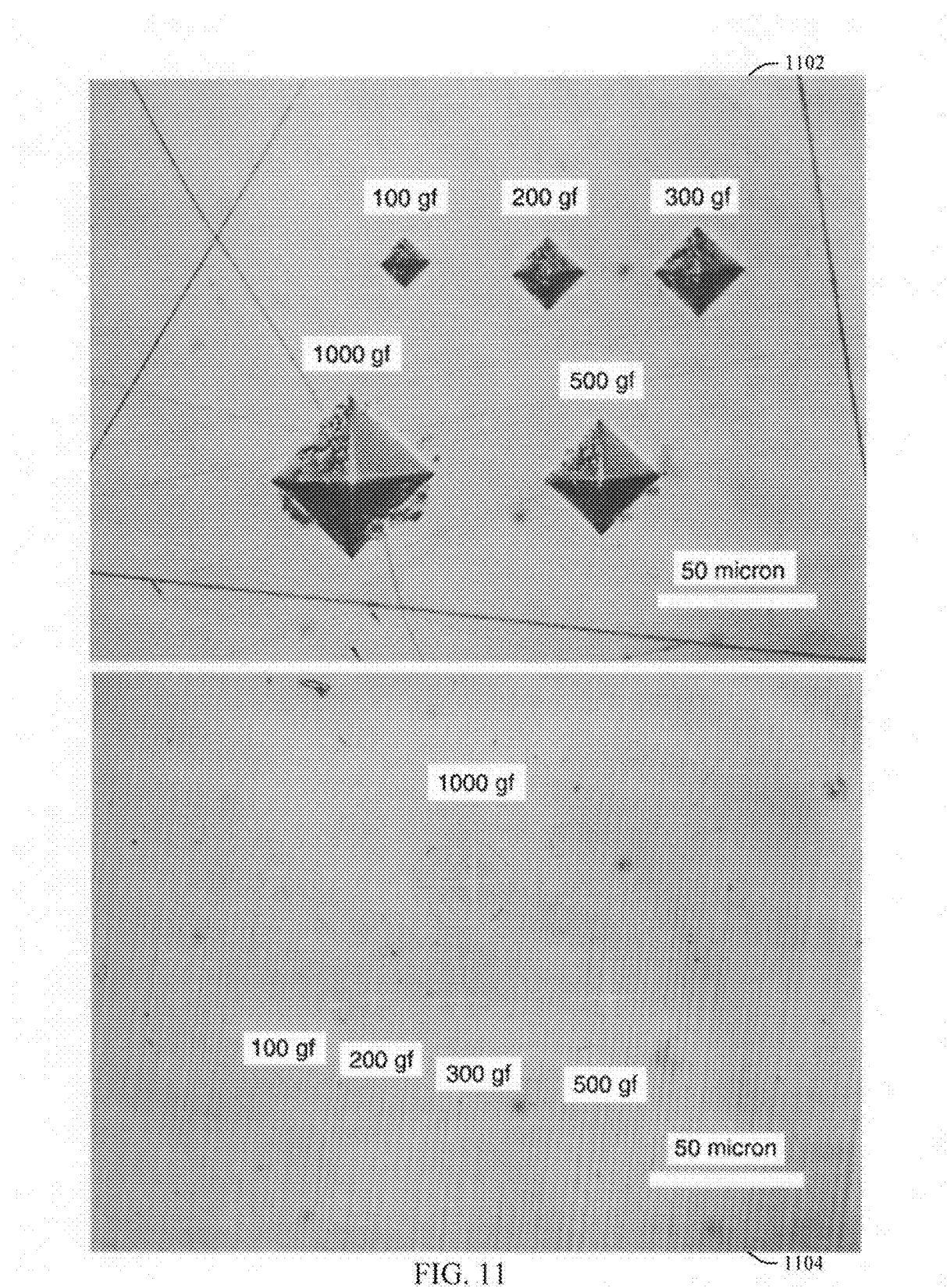
FIG. 11 shows indentations on an ASAHI 72553 etalon hardened steel as compared to those of a sample of Diamonite-B sintered at 1 GPa.

FIG. 11 shows indentations on an ASAHI 72553 etalon hardened steel at 1102 as compared to those of a sample of Diamonite-B sintered at 1000 MPa at 1104. The corresponding hardness data can be seen in FIG. 10B. Samples of Diamonite-B sintered under P=1000 MPa pressure scratch any hardened steel ($H_M \leq 7$, $H_V$=5-10 GPa). The hardness of Diamonite-B varies from $H_V$=11.5 to 21.3 GPa.

In further experiments, results of sliding friction and wear of materials discussed herein were obtained. The experiments were performed on sliding friction and wear of bearing inserts in the ambient temperature and air pressure environment, in a vacuum cryogenic chamber, and in a $CO_2$ environment show that the developed composite inserts and coatings maintain low or acceptable friction coefficients (CoF) and wear in a range of conditions, including at conditions similar to that of the Moon surface. Friction and wear of conventional diamond and graphite materials drastically increase in vacuum as compared with ambient air, except for highly hydrogenated diamond-like materials, where the reverse is true. The results of the research are presented in Table 1 below. Notably, some of the materials developed and described herein have acceptable friction coefficients (CoFs) and wear under multiple conditions, including some in both air and vacuum.

TABLE 1

| Pin | Disc | Conditions | CoF | Wear Observed |
| --- | --- | --- | --- | --- |
| Diamonite-A | Diamonite-A | Air | 0.016 | Very slight |
| Diamonite-B | Diamonite-B | Air | 0.020 | Very slight |
| Diamonite-C | Diamonite-C | Air | 0.032 | Very slight |
| HPS Diamond | HPS Diamond | Air | 0.016 | Slight |
| HPS Diamond | DBC-RCF | Air | 0.002 | Slight |
| Diamonite-A | Diamonite-A | Vacuum | 0.040 | Moderate |
| Diamonite-B | Diamonite-B | Vacuum | 0.010 | Extreme wear |
| Diamonite-C | Diamonite-C | Vacuum | 0.120 | Moderate pin wear |
| HPS Diamond | DBC-RCF | Vacuum | 0.220 | Moderate |
| Diamonite-C | Diamonite-C | Vac/Cryo | 0.127 | Build up on pin |
| HPS Diamond | DBC-RCF | Vac/Cryo | 0.420 | Very slight non measurable wear |
| Diamonite-C | Diamonite-C | $CO_2$ (4 psi) | 0.115 | Very slight non measurable wear |

Diamonite-C is a D/C composite as it is disclosed above. DBC-RCF is a diamond based composite coating reinforced by carbon fibers as disclosed herein. HPS Diamond is a high pressure synthetic polycrystalline diamond article as it is fabricated via a method of graphite-diamond transformation under high pressure and further high pressure sintering of diamond powder.

Results of research discussed herein show that the carbon-base composites fabricated by the disclosed methods can be used for sliding-thrust bearing in a variety of environments, such as Earth, Moon and Mars environments. Friction coefficients and wear are relatively small or not observable. Sliding bearing experiments were performed without lubricants, so the data presented in Table 1 is for non-lubricated bearing interfaces. Some materials of the subject innovation can have a sliding friction coefficient less than 0.1 in air, less than 0.2 in vacuum, less than 0.2 in vacuum at cryogenic temperature and less than 0.2 in low pressure carbon dioxide environments.

Figure 12:
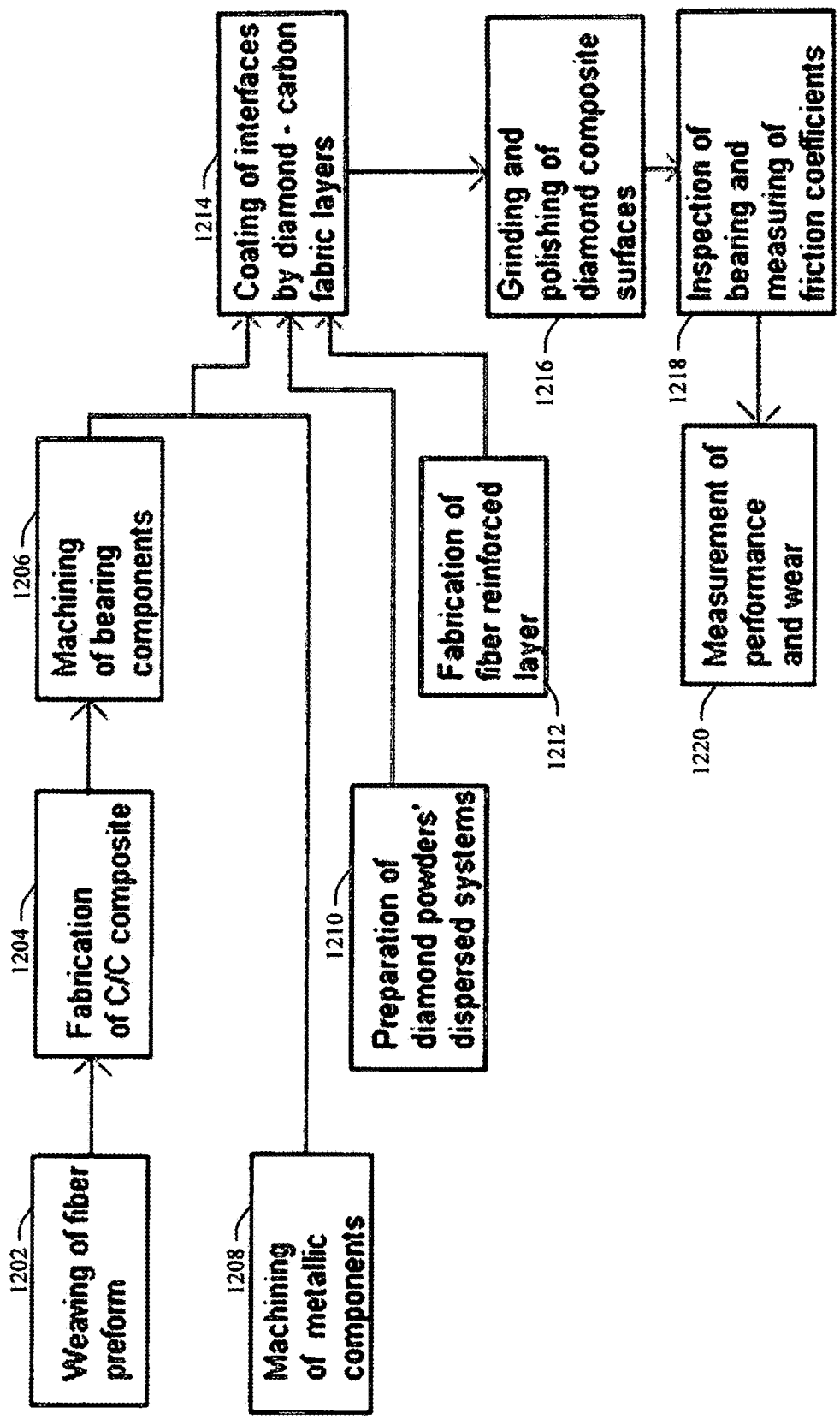
FIG. 12 shows a flowchart of an example method of fabricating a diamond-coated bearing reinforced by carbon fibers, in accordance with aspects of the innovation.

FIG. 12 illustrates a flowchart of an example method for creating a coating for a bearing in accordance with aspects of the subject innovation. The method can include the following acts: at 1202, a preform fiber can be woven; at 1204, a C/C composite can be fabricated; at 1206, bearing components can be machined; at 1208, metallic components can be machined; at 1210, diamond powders' dispersed systems can be prepared; at 1212, a fiber reinforced layer can be fabricated; at 1214, interfaces can be coated by diamond-carbon fabric layers; at 1216, diamond composite surfaces can be ground and polished; at 1218, the bearing can be inspected and friction coefficients can be measured; and at 1220, performance and wear can be measured. This method can be used to fabricate diamond coated bearings reinforced by carbon fibers, that can be suitable for low temperature applications.

Figure 13:
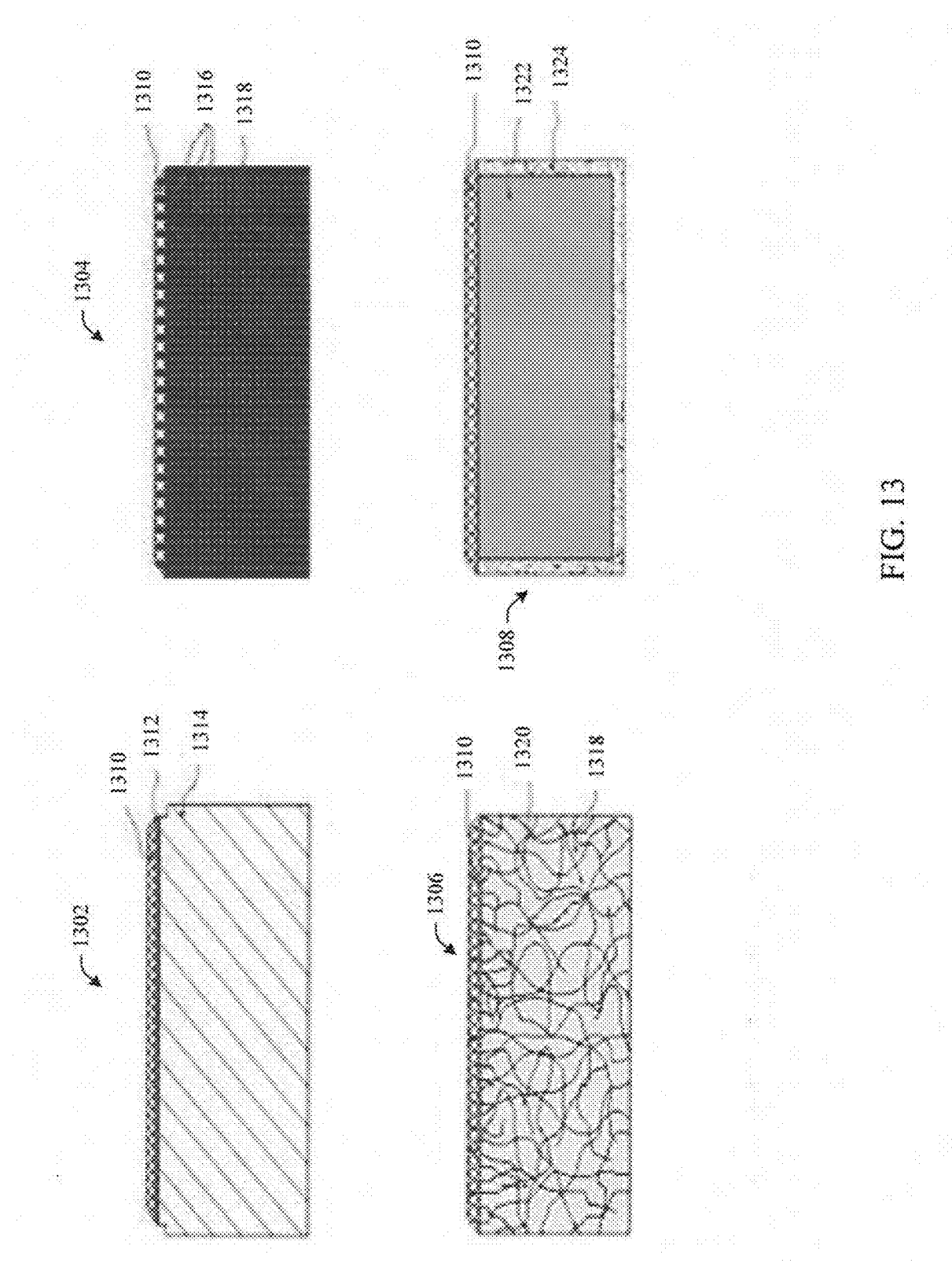
FIG. 13 depicts four drawings indicating example discs constructed according to embodiments of the subject innovation.

FIG. 13 illustrates four different embodiments of discs 1302, 1304, 1306, and 1308, according to various aspects of the subject innovation. Disc 1302 can comprise a diamond based composite (DBC) coating 1310, reinforced with a polymeric fabric of carbon-based fibers 1312, on an aluminum (Al)-based allow substrate 1314. Disc 1304 can comprise a DBC coating 1310, reinforced by a 3D-carbon fabric of carbon (e.g., graphitic) fibers 1316, on a carbon (e.g., graphite) matrix 1318; disc 1304 can be a disc with diamond coating reinforced by carbon fibers on a 3D-C/C composite substrate and with a pitch-derived matrix carbonized under pressure. Disc 1306 can comprise a DBC coating 1310, reinforced by carbon fibers (e.g., carbon felt or carbon (e.g., graphite) fibers) 1320, in a carbon (e.g., graphite) matrix 1318 as a C/C substrate. Finally, disc 1308 can comprise a DBC coating 1310 reinforced by carbon fibers, on a C/C composite substrate 1322, with a SiC coating 1324.

Figure 14:
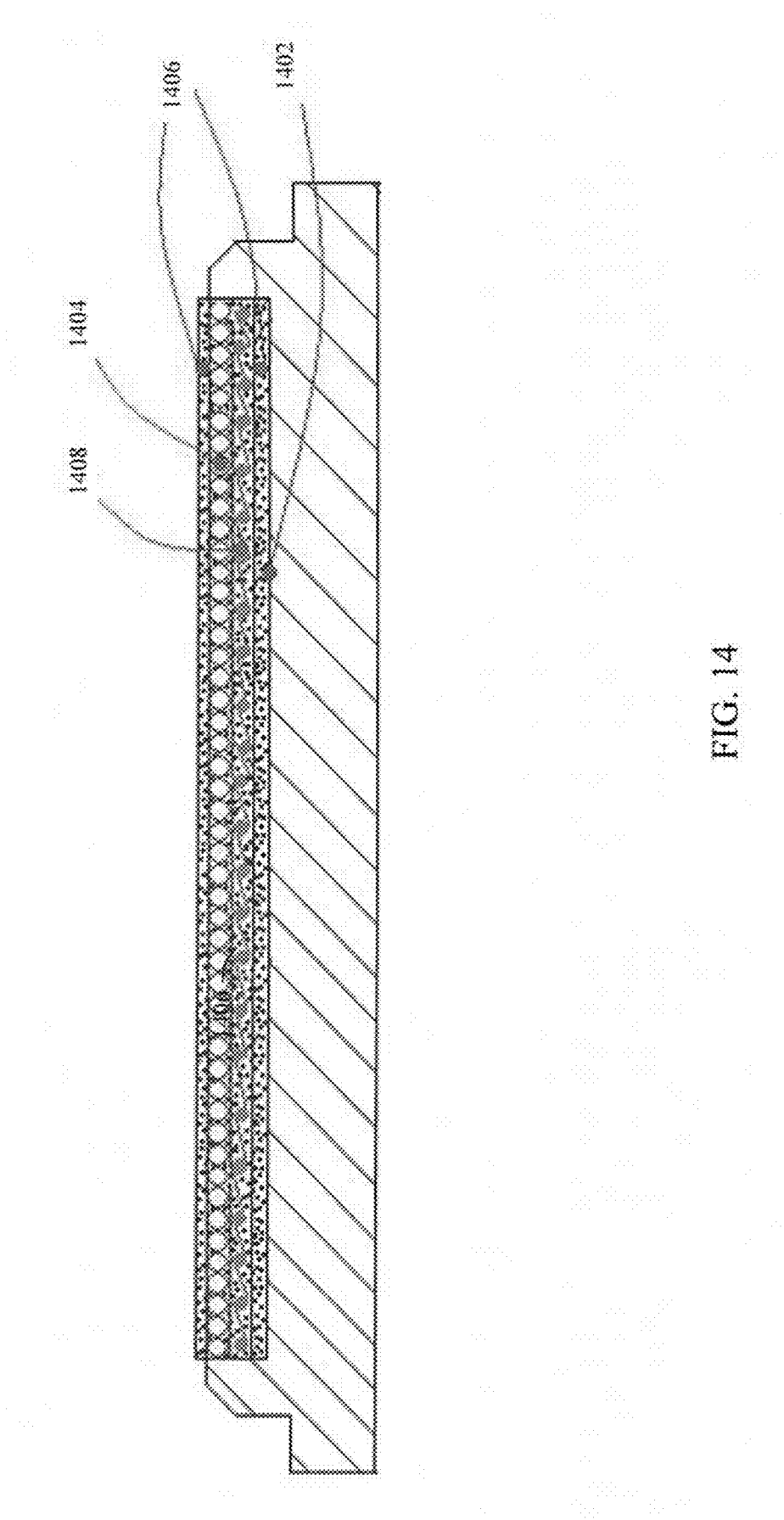
FIG. 14 illustrates an example diamond-dispersed fiber-reinforced composite coating of a bearing surface.

FIG. 14 illustrates a cross-sectional view of an example of a diamond-dispersed fiber-reinforced composite coating on a bearing surface. Indicated in FIG. 14 are a bearing interface 1402, diamond particles 1404 dispersed in an organic matrix 1406, and a fiber (or fabric) reinforcement 1408 of the composite coating.

Figure 15:
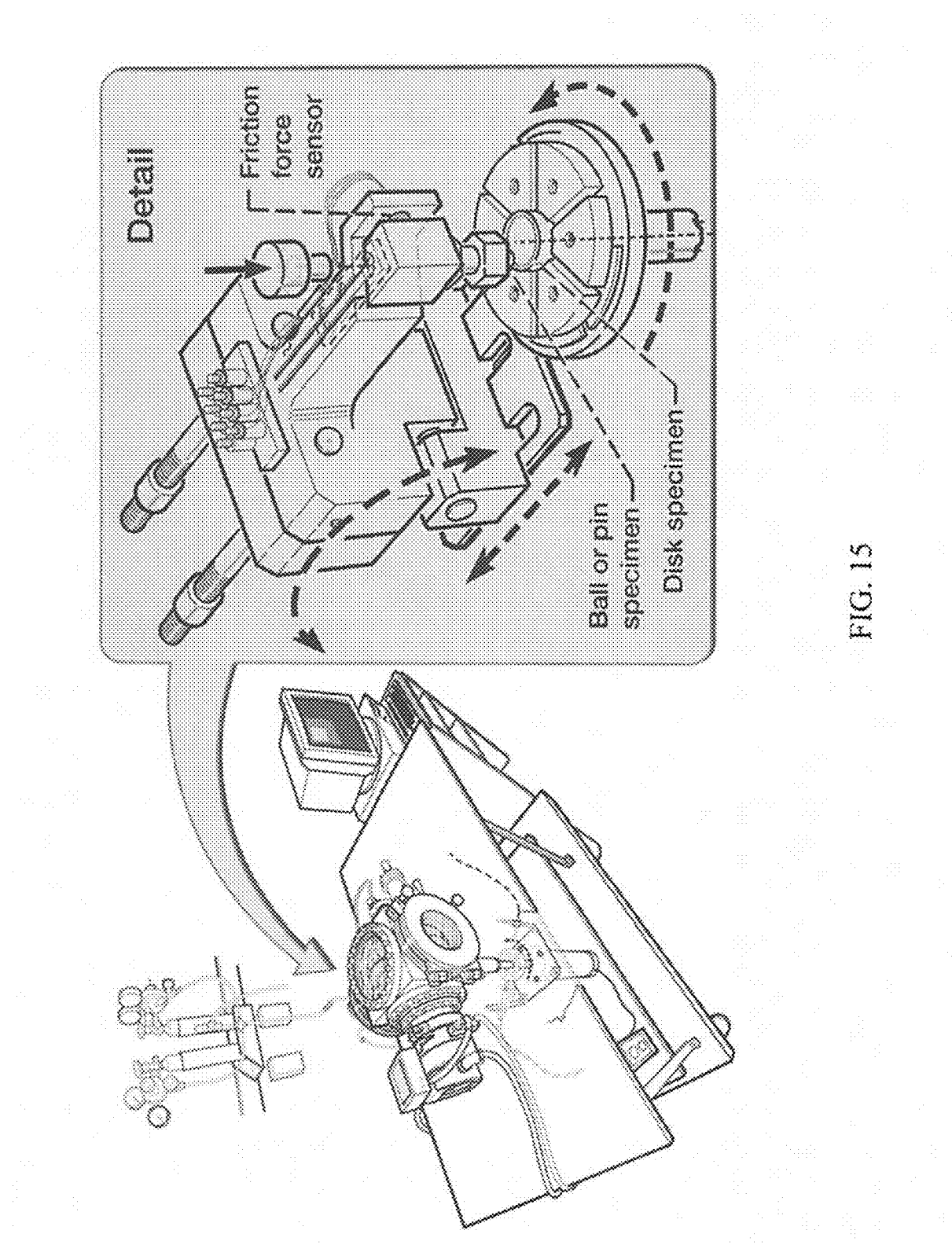
FIG. 15 illustrates a schematic of the Ultra High Vacuum pin-on-disc tribometer used to obtain results discussed herein.
Figure 16A:
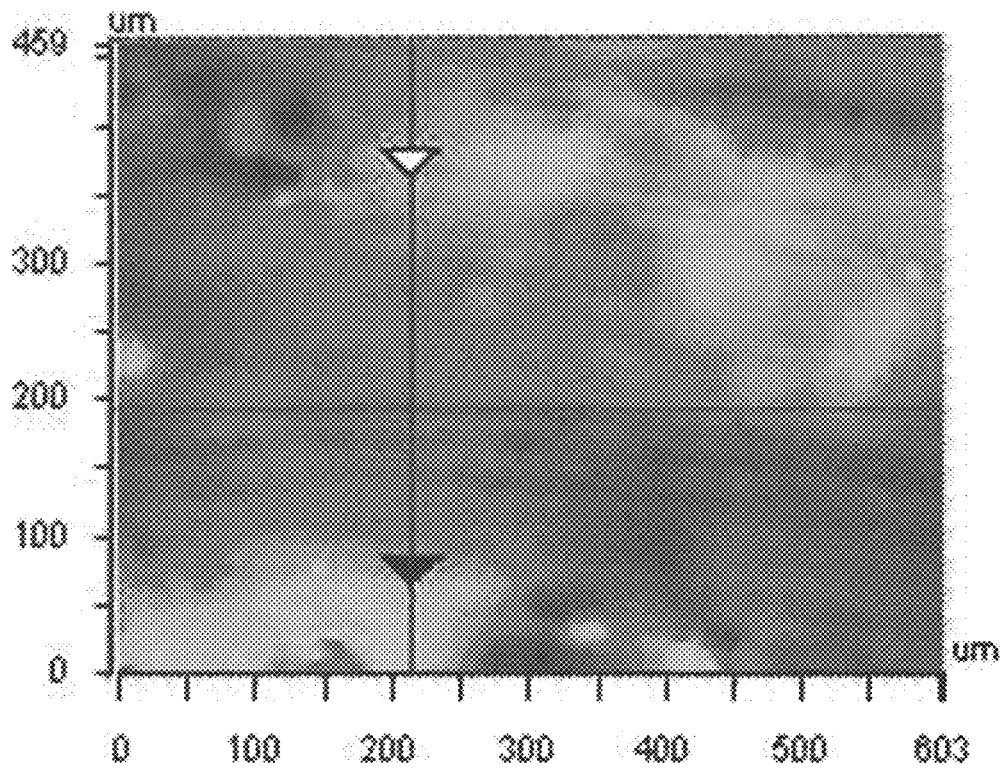
FIG. 16A shows wear data in a track of a disc via a 3D profile of a track with a slice of the track where a profile was used to determine width and depth of wear.
Figure 16B:
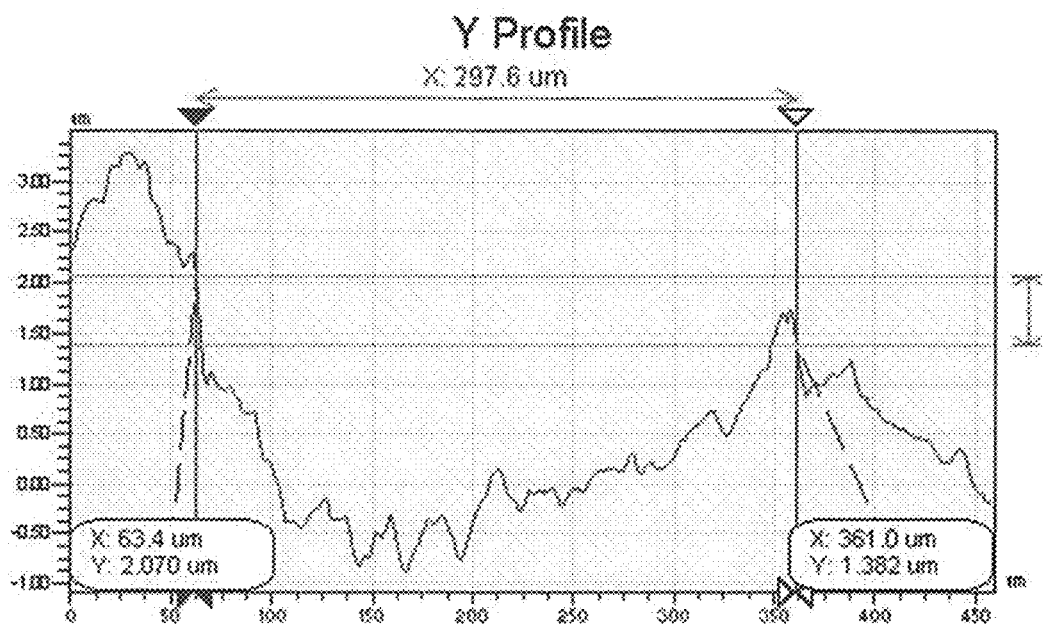
FIG. 16B shows additional wear data in the track of the disc via a 2D profile across the track, indicating width and depth of track.
Figure 17:
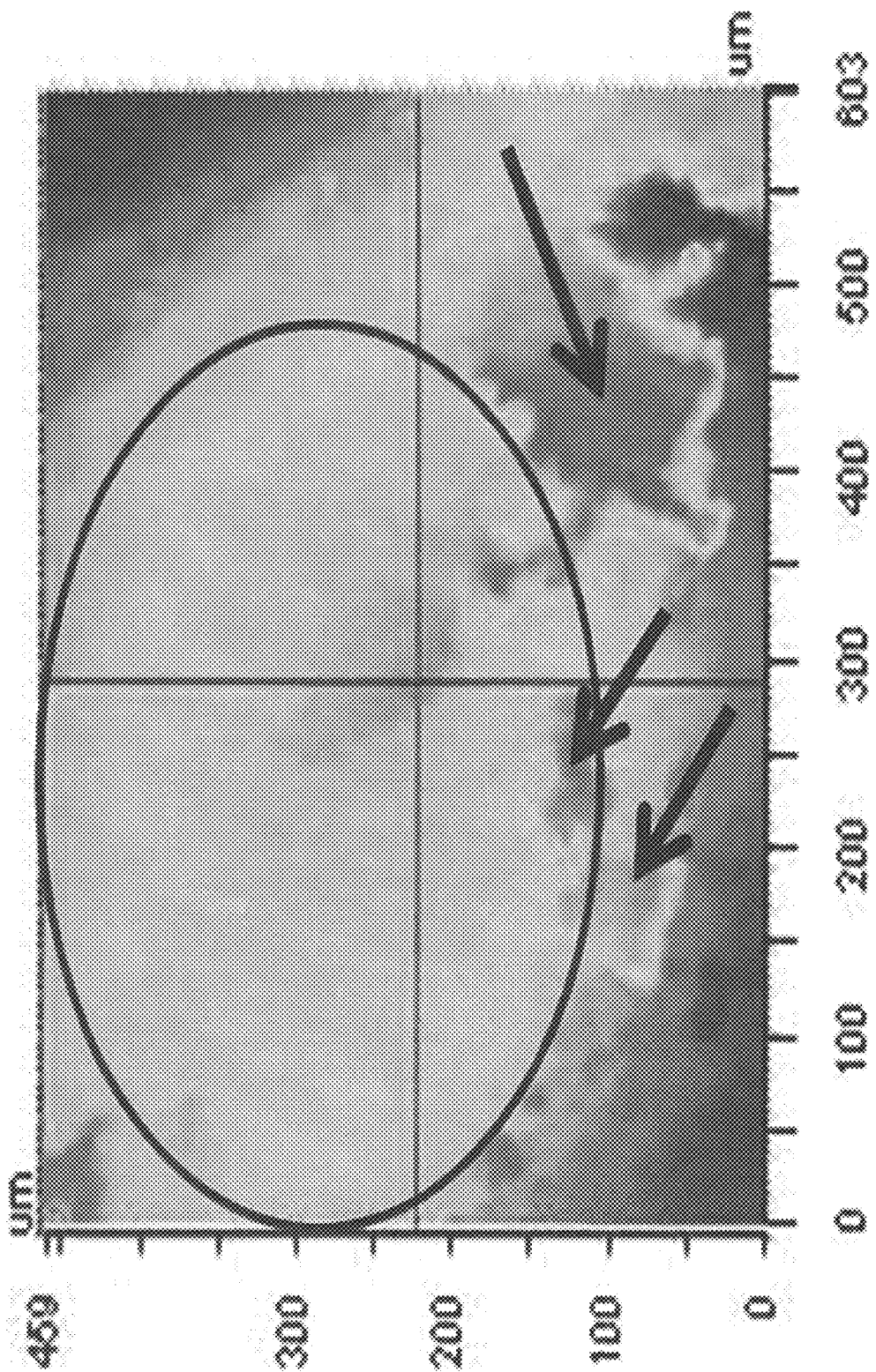
FIG. 17 shows a graph indicating measurements of wear on the pin and build-up of transfer debris in a tribology experiment.

FIG. 15 illustrates a schematic of the Ultra High Vacuum pin-on-disc tribometer used to obtain results discussed herein. FIG. 16A indicates measurement of wear in a track of the disc from experiments conducted herein. FIG. 16A is a 3D profile of the track with a slice of the track where the profile was used to determine the width and depth of the wear, indicated by the black vertical line. FIG. 16B shows a 2D profile across the track at the black line, indicating the width and depth of the track in red. FIG. 17 shows additional measurements of the wear on the pin in experiments discussed herein, as well as build-up of transfer debris. The wear area approximately corresponded to the black oval on FIG. 17, and wear debris from the track is identified by the arrows.

Other non-limiting examples of methods of creating coatings and components according to aspects of the innovation include the following. In a first example, test pieces of experimental sliding trust bearing components with diamond composite coating can be fabricated by a process that can include the following steps: (1) making a metallic substrate; (2) mixing starting components; (3) placing fibers and the mixture onto a bearing surface of the metallic substrate; (4) cold pressing the fibers and the mixture to obtain a uniformly dense preformed composite coating; (5) ambient pressure heat treating to harden a fully dense composite coating; (6) machining and polishing by diamond tools to obtain sliding trust bearings; and (7) assembling the finished bearings for rig testing. This process can be used to make experimental components of sliding thrust bearings with diamond composite coating for low temperature-vacuum-abrasive dust application, lunar environment application and other applications.

A second example can include a method used to make a monocrystalline diamond grains/epoxy matrix/organic fabric composite coating. This method can include the acts of (1) making an aluminum alloy substrate; (2) Mixing resin and hardener components of an epoxy with around 600/400 monocrystalline diamond grains in weight ratios of around 16:8:76; (3) placing organic 2-D fabric mixed with resin and hardener onto bearing surface, and placing diamond-epoxy mixture onto bearing surface of metallic substrate; (4) Compressing under pressure of around 10 MPa at temperature around 24° C. to obtain uniformly dense preformed composite coating; (5) Ambient pressure heat treatment at temperature around 24° C. for a holding time of around 24 hours to harden fully dense composite coating; (6) Machining and polishing by diamond tools to obtain sliding thrust bearings; and (7) Assembling the finished bearings for rig testing.

A third example is the following method of fabricating a monocrystalline diamond grains/epoxy matrix/carbon fiber composite coating, including the steps of (1) Making aluminum alloy substrate; (2) Mixing the hardener component of epoxy with around 60/40 and 2/1 monocrystalline diamond grains in weight ratio of approximately 12:63:25; Mixing the resin component of epoxy with around 600/400 monocrystalline diamond grains in weight ratio of approximately 12:88; Mixing the first and the second mixture in weight ratio of approximately 32:68; (3) Placing carbon fibers mixed with resin and hardener onto bearing surface, and placing diamond-epoxy mixture onto bearing surface of metallic substrate; (4) Compressing under pressure around 1 MPa at temperature of about 24° C. to obtain uniformly dense preformed composite coating; (5) Ambient pressure heat treatment at temperature in the neighborhood of 177° C. for a holding time of around 1 hour to harden fully dense composite coating; (6) Machining and polishing by diamond tools to obtain sliding trust bearings; and (7) Assembling the finished bearings for rig testing.

A fourth example includes the following method to make a polycrystalline diamond grains/epoxy matrix/glassy fabric composite coating, including the acts of (1) Making titanium alloy substrate; (2) Mixing the hardener component of epoxy with around 60/40 monocrystalline diamond grains in weight ratio of approximately 16:84; Mixing the resin component of epoxy with around 600/400 polycrystalline diamond grains in weight ratio of about 12:88; Mixing the first and the second mixture in weight ratio approximately 26:74; (3) Placing glassy fabric mixed with resin and hardener onto bearing surface, and placing diamond-epoxy mixture onto bearing surface of metallic substrate; (4) Compressing under pressure around 100 MPa at temperature of about 24° C. to obtain uniformly dense preformed composite coating; (5) Ambient pressure heat treatment at temperature of around 120° C. for a holding time of about 4 hours to harden fully dense composite coating; (6) Machining and polishing by diamond tools to obtain sliding trust bearings; and (7) Assembling the finished bearings for rig testing. Each of the foregoing non-limiting examples illustrates specific embodiments of the subject innovation, which is intended to encompass other variations that would be apparent to a person of skill in the art in light of the teachings herein.

Systems, articles of manufacture, and methods of the subject innovation allow for a variety of applications, being usable as parts and coatings in a variety of settings, including environments where conventional materials are subject to significant wear. Applications include aerospace applications, manufacture of parts or coatings for parts on aircrafts, spacecrafts, or other vehicles, both for use on Earth and elsewhere. Additionally, there are numerous other applications, such as in parts, components, etc. used in a range of environments, such as hot, cold, dusty, etc., such as on the Moon, or in deserts such as in Iraq or Afghanistan. Systems, articles of manufacture, and methods of the subject innovation can be used in any applications where parts with high hardness and wear resistance are advantageous.

Potential commercial applications include applications for which diamonds or other high hardness materials are used, as well as others. Examples include fabrication of diamond or composite materials and tools, such as sliding bearings, saw blades, and other materials and tools. Additionally, materials of the subject innovation can be used as heat sinks, for example, as a large area thermal sink: diamond is an electrical insulator and the best thermal conductor in the room temperature range, and materials of the subject innovation have comparable properties with other advantages, such as cost and fracture resistance. The subject innovation can be used to provide diamond or composite bearings and fiber reinforced diamond composite (or other composites disclosed herein) tools (e.g., saw blades, etc.). Diamond is widely used in tools: cutting inserts, smoothing inserts, drill bits, wire dies and others. These applications of diamond are determined by highest hardness of diamond among all minerals and materials. Diamond is able to machine all materials, including diamond materials. Any of these tools (or others) can be made of or coated with materials of the subject innovation. Materials of the subject innovation are applicable in a wide range of harsh environments, such as low or high temperature, and/or in extremely dusty conditions.

In other words, what has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A composite material, comprising:
    a mixture, comprising:
        a plurality of diamond particles between and including 600 to 1000 microns in size;
        a fabric compound of a plurality of fibers or wires; and
        an organic epoxy matrix,
    wherein prior to being hardened, the mixture is compressed under a pressure including and between ambient (0.1 MPa) and 99 MPa; and
    wherein the mixture is hardened at a temperature including and between room temperature and 200° C. for a predetermined time wherein the material has a sliding friction coefficient less than 0.1 in air, less than 0.2 in vacuum, less than 0.2 in vacuum at cryogenic temperature and less than 0.2 in low pressure carbon dioxide environments.

2. The material of claim 1, wherein the diamond particles comprise at least one of monocrystalline or polycrystalline grains.

3. The material of claim 1, wherein the organic epoxy matrix further comprise a hardener component of an epoxy.

4. The material of claim 1, wherein the fibers comprise one or more of organic fibers, carbon fibers, glassy fibers, silica fibers, alumina fibers, silicon carbide fibers, or metallic wires.

5. The material of claim 1, wherein the material is applied as a coating.

6. The material of claim 1, wherein the plurality of diamond particles comprise at least 34% of the volume of the mixture.

7. A method of fabricating a composite material, comprising:
    preparing a mixture comprising diamond particles between and including 600 to 1000 microns in size, an organic epoxy matrix, and a fabric comprised of a plurality of fibers or wires;
    forming the mixture into a position;
    compressing the mixture, prior to hardening, under a pressure including and between ambient (0.1 MPa) and 99 MPa; and
    hardening the mixture to form the composite material, wherein hardening the mixture comprises hardening the mixture at a temperature including and between room temperature and 200° C. for a predetermined holding time, wherein the material has a sliding friction coefficient less than 0.1 in air, less than 0.2 in vacuum, less than 0.2 in vacuum at cryogenic temperature and less than 0.2 in low pressure carbon dioxide environments.

8. The method of claim 7, wherein the organic epoxy matrix further comprise a hardener component of an epoxy.

9. The method of claim 7, wherein the fibers comprise one or more of organic fibers, carbon fibers, glassy fibers, silica fibers, alumina fibers, silicon carbide fibers, or metallic wires.

10. The method of claim 7, wherein the diamond particles comprise at least one of monocrystalline or polycrystalline grains.

11. The method of claim 7, wherein pressing the mixture comprises compressing under a pressure of between 1 MPa and 99 MPa at the room temperature.

12. The method of claim 7 wherein the elevated temperature is between 20° C. to 200° C.

13. The method of claim 7, wherein forming the mixture into the position comprises applying the mixture as a coating.

* * * * *